(12) United States Patent
Hamlyn et al.

(10) Patent No.: US 11,726,943 B2
(45) Date of Patent: Aug. 15, 2023

(54) CIRCUITS AND METHODS FOR ENABLING REDUNDANCY IN AN ELECTRONIC SYSTEM EMPLOYING COLD-SPARING

(71) Applicant: TallannQuest LLC, Plano, TX (US)

(72) Inventors: Mark Hamlyn, Murphy, TX (US); David A. Grant, Edinburgh (GB)

(73) Assignee: Apogee Semiconductor, Inc., Plano, TX (US)

( * ) Notice: Subject to any disclaimer, the term of this patent is extended or adjusted under 35 U.S.C. 154(b) by 176 days.

(21) Appl. No.: 17/194,221

(22) Filed: Mar. 6, 2021

(65) Prior Publication Data

US 2021/0279197 A1 Sep. 9, 2021

Related U.S. Application Data

(60) Provisional application No. 62/986,610, filed on Mar. 6, 2020.

(51) Int. Cl.
| | | |
|---|---|---|
| G06F 13/40 | (2006.01) |
| H01L 27/02 | (2006.01) |
| H01L 27/092 | (2006.01) |
| H03K 19/003 | (2006.01) |
| H03K 19/013 | (2006.01) |

(52) U.S. Cl.
CPC ...... *G06F 13/4072* (2013.01); *H01L 27/0203* (2013.01); *H01L 27/092* (2013.01); *H03K 19/00315* (2013.01); *H03K 19/0136* (2013.01)

(58) Field of Classification Search
None
See application file for complete search history.

(56) References Cited

U.S. PATENT DOCUMENTS

| | | | |
|---|---|---|---|
| 5,117,129 A | 5/1992 | Hoffman et al. |
| 5,532,621 A * | 7/1996 | Kobayashi | H03K 19/018592 |
| | | | 326/86 |
| 5,942,923 A | 8/1999 | Gotoh |
| 6,081,412 A * | 6/2000 | Duncan | H03K 19/00315 |
| | | | 361/111 |
| 6,169,420 B1 * | 1/2001 | Coddington | H03K 19/00315 |
| | | | 326/82 |
| 10,135,443 B1 | 11/2018 | Ross |
| 10,624,246 B2 | 4/2020 | Li et al. |

* cited by examiner

*Primary Examiner* — Anh Q Tran
(74) *Attorney, Agent, or Firm* — Gregory A. Magel

(57) ABSTRACT

CMOS output stages, electrostatic discharge (ESD) protection circuits and input bus-keeper functions are provided that block dc and ac leakage paths within inactive powered-down integrated circuits used in redundant high-reliability system configurations employing cold-sparing to provide backup circuitry. These circuits and methods avoid both undesirable power consumption in a cold-spared backup unit and loading of connected active units when powered down, without compromising performance or functionality of the backup unit when in its active powered state. Inputs and outputs using an analog majority voting principle to implement in-circuit redundancy for on-chip fault tolerance are also provided, incorporating the low-leakage principles of the invention for low power dissipation when powered down. Such on-chip redundancy can harden an IC against various faults, such as single-event effects in high-radiation environments, while maintaining the other advantages in a cold-sparing system.

10 Claims, 14 Drawing Sheets

CIRCUITS AND METHODS FOR ENABLING REDUNDANCY IN AN ELECTRONIC SYSTEM EMPLOYING COLD-SPARING

This application claims the benefit under 35 U.S.C. 119(e) of U.S. Provisional Application No. 62/986,610, filed Mar. 6, 2020.

BACKGROUND OF THE INVENTION

1. Field of the Invention

This invention is directed to the field of high-reliability electronic systems, and, more particularly, to circuits and methods that facilitate redundancy in an electronic system while reducing power consumption in backup units.

2. Description of the Related Art

Electronic circuits may experience failures in their operation due to various reasons, particularly when operating in harsh environments, such as extreme temperatures and strong radiation, which are typical of spaceborne applications. A failure event is defined here as an instance in which a circuit's operation deviates from its normal functionality to an extent that intolerably affects the overall system performance. An example of such failure in an analog circuit may be the reduction in gain of an amplifying device to a value below its specified range of gain. An example of a failure in a digital logic gate may be a "stuck at 0" or "stuck at 1" fault, which prevents it from toggling between the two logic levels. Such failures may be the result of radiation effects, exposure to extreme temperatures, electro-static discharge (ESD), aging, or any other cause.

A failure is considered temporary if the circuitry can recover from it without being physically repaired. Such failure in a circuit's operation may be the result of interference induced onto it from some external source, temporary exposure to an extreme ambient temperature, a single-event effect (SEE) or single-event upset (SEU) originating from an energetic particle (as is experienced in environments such as particle accelerators and spacecraft), or any other cause. A failure would be considered permanent if it is the result of permanent physical damage that is caused by electrostatic discharge, excessive supply voltage, excessive total-ionizing dose (TID) of radiation, or any other cause.

In a system required to function in harsh or inaccessible environments, it is frequently desirable to provide mechanisms for allowing the system to continue to operate while experiencing either permanent or temporary failures in portions of its circuitry. Various solutions for high-reliability systems have been demonstrated that allow for multiple functional blocks or system components to serve as backups for one another, wherein a fault in one such element can result in its replacement by a backup unit. However, previous solutions have typically involved tradeoffs requiring compromises in functional performance beyond the need for simply supplying additional redundant backup circuitry, such as incurring additional power consumption in the backups.

In particular, several existing solutions, where a cold-sparing configuration is employed in which a plurality of alternate units having common outputs and/or inputs are connected in parallel, result in undesirable power consumption into a cold-spared backup unit despite its inactivity. Such wasted power is typically the result of leakage current paths created by the active signals that are present on the output and/or input ports of the cold-spared backup unit while it is powered down and/or otherwise disabled.

SUMMARY OF THE INVENTION

The present invention addresses the problem of loading of input and output signals and wasted power consumption experienced in electronic systems operating in cold-sparing configurations, wherein multiple functional units that are connected in parallel may each be powered down in order to be placed in standby when serving as a backup unit. The circuits and methods provided herein serve to effectively minimize the cost and performance penalties associated with cold-sparing configurations. In particular, the present invention allows for the minimization of leakage currents into the outputs and inputs of cold-spared units that in prior art systems would cause loading and wasted power consumption.

More specifically, the present invention provides a cold-sparable low-leakage output stage for a MOS IC. The output stage has a low-side branch with an NMOS transistor similar to conventional circuitry, but the high-side branch contains additional transistors configured to shut off and block leakage currents that can occur when the output stage is cold-spared and high logic signals are asserted on the output by other enabled units in a cold-spared system connected in parallel with the IC. A fundamental principle of the invention is a method of using back-to-back pairs of PMOS transistors with their sources connected together such that their body diodes are reversed to block leakage currents that would flow through a single transistor used by itself. Additional transistors are employed to ensure proper normal (powered) operation without performance penalties. Versions of a low-leakage output stage are provided that are suitable for low frequency systems, systems with external signals having many transitions or high frequency, and systems that require a split complementary output. Tri-state capable versions of a low-leakage output stage are also provided for use in all of the above types of systems, using a novel version of a transmission gate that makes use of the back-to-back PMOS transistor principle to enable a tri-state mode when powered, while blocking leakage paths from the output pad back into the drive path and control logic while in cold-spared mode.

The present invention also provides a low-leakage bus-keeper input latch circuit for use on inputs in a cold-spared device to maintain a logic state at the input of an IC in the absence of an external logic signal while the input latch is in the powered state, while also blocking current paths that can result in high power dissipation while in a cold-spared state. A novel inverter design that employs a back-to-back pair of PMOS transistors to block leakage paths to $V_{DD}$ is used in the bus-keeper latch.

The present invention further provides a low power dissipation charged-device model (CDM) electrostatic discharge (ESD) protection clamp circuit that uses a novel configuration of NMOS transistors including an additional transistor to block leakage paths to the $V_{DD}$ terminal when the circuit is cold-spared and the $V_{DD}$ terminal may be at ground potential. This CDM ESD circuit can be used in conjunction with an optional bus-keeper circuit of the type discussed above, and on majority-voting input circuits also provided as embodiments of the present invention. A low-loading human-body model (HBM) ESD suitable for use at input/output pads on a cold-spared IC is also provided.

The present invention additionally provides a low power dissipation cold-sparable majority voting output circuit having built-in fault tolerance as a consequence of triple redundancy, that operates on a novel analog majority voting principle using three or more parallel outputs to sum at a common node. The majority voting output circuit can be used in conjunction with majority-voting inputs also provided herein to provide a low power dissipation cold-sparable I/O with redundancy on both inputs and outputs, making them unaffected by single-event effects due to ionizing radiation or other extreme environments, and other transient or permanent malfunctions that affect a minority of the parallel input or output channels. Incorporation of the low-leakage ESD protection circuits and output stages provided herein as well as optional bus-keeper functionality can offer this high-reliability redundancy feature in combination with all the low-leakage cold-sparing capabilities provided herein.

Other features and advantages of the present invention will be apparent to those of ordinary skill in the art upon reference to the following detailed description taken in conjunction with the accompanying drawings, which are to be understood to be exemplary and explanatory, and are intended to provide further explanation of the invention as claimed.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

The techniques and structures described below may be applied in fields and applications beyond those specified here as examples, and the disclosed invention is therefore not to be considered limited to the applications and examples used here for the sake of explaining its principles of operation.

Embodiments described herein are generally directed to integrated circuits, but may be realized at different levels of integration, e.g. monolithically, in a multi-chip-module (MCM), in multiple separately packaged ICs, or even in separate chassis. For example, connections referred to herein as "pads" or "pins" may refer to any of pads on an IC die; pins, pads, lands, bumps, or other connections on an IC package; or pins or other connections to a board or chassis containing circuitry designed according to the principles of the present invention. Furthermore, the principles taught herein may be applied to multiple cold-sparable functional elements within an IC, in which sections might be deactivated independently to save power. In such a case, a "pad" or "pin" described herein may be interpreted as referring to an internal connection node within such an IC.

Figure 1:
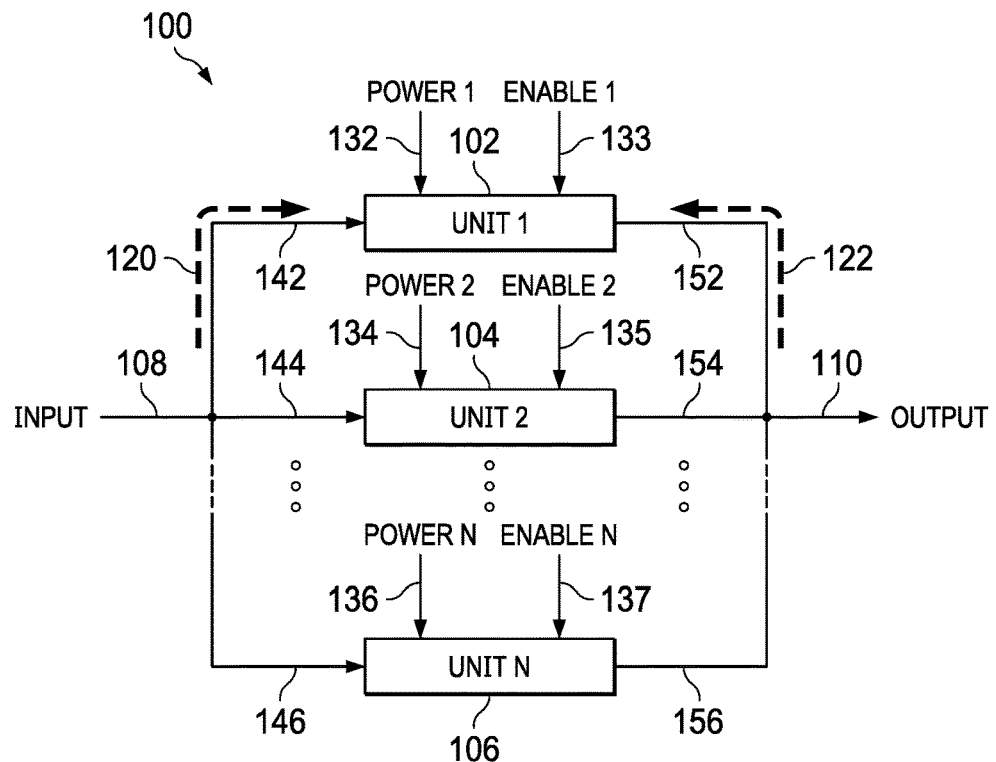
FIG. 1 is a block diagram of a system employing a cold-sparing configuration for redundancy-based high-reliability operation.

Referring now to FIG. 1, a block diagram of a system 100 employing cold-sparing for redundancy is shown. The inputs and outputs of a plurality N>1 of functional units 102, 104, 106, etc., which may be designed identically to perform the same function for redundancy, are connected in parallel, with typically only one of them intended to be enabled and/or powered at a given instance. Each such unit 102-106 has at least one input port or one output port, as shown in the block diagram, but may also have a plurality of inputs and/or a plurality of outputs. The system's shared input 108 and shared output 110 may therefore each represent either a single port or a plurality of ports. For example, UNIT 1 (102) through UNIT N (106) may be identical memory ICs that each has an address bus of 12 bits and a data bus of 8 bits. As another example, each unit may represent a dual 3-input AND gate IC, which would have a total of 6 inputs and 2 outputs. Power inputs 132, 134, and 136, corresponding to POWER 1 (132) through POWER N (136) may represent separate power supply sources that are used to power UNIT 1 (102) through UNIT N (106) respectively, or alternatively may have individual switches (not shown in FIG. 1) that allow a common supply to be used for all, or some subset of units. UNIT 1 (102) through UNIT N (106) may also have enable ports 133, 135, and 137, corresponding to ENABLE 1 (133) through ENABLE N (137) respectively, which allow units 102, 104, and 106 (and respective additional units in between) to be enabled and disabled by a control unit (also not shown in FIG. 1). Such an external control unit can select which one of the N units would be enabled to fulfill the system's desired function, while the other N-1 units are 'cold-spared,' i.e., disabled and/or powered-down.

If, for example, unit 104 (UNIT 2) is active, i.e., selected for operation by allowing POWER 2 (134) to be provided, and by applying the appropriate ENABLE 2 (135) signal, if such exists, then unit 102 (UNIT 1), for example (and similarly other units), is assumed to be cold-spared, i.e., not selected for operation; either being powered down, i.e. POWER 1 (132) not present, or otherwise disabled by applying an appropriate disable signal to ENABLE 1 (133), if such a control input exists. The operation of system 100, represented by shared output 110, then uses the shared input signal (or plurality of signals) 108 to serve as the input (or plurality of inputs) 144 applied to UNIT 2 (104). Output 154 of UNIT 2 serves as the output of system 100 (which may also comprise a plurality of signals), while the other units connected in parallel to UNIT 2 (104), including unit 102

(UNIT 1) and unit 106 (UNIT N), must not interfere with such operation. In practice, however, leakage current 120, flowing from the shared active input 108 into input 142 of inactive UNIT 1 (102) may be non-zero, depending on the input circuitry of UNIT 1 (102). Similar input leakage currents may occur simultaneously or alternately at other units such as into input 142 of unit 102 (UNIT 1) and input 146 of unit 106 (UNIT N). Since it is typical for many ICs to have protection circuitry at their inputs to allow them to withstand high voltages originating from electrostatic discharge (ESD), such a leakage path may, for example, be created by internal ESD protection components.

Similarly, at the shared output 110 of system 100, which may also comprise a plurality of signals, inactive output 152 of cold-spared unit 102 (UNIT 1) may provide a leakage current path 122 for a signal at output 154 of unit 104 (UNIT 2), which is active, and leakage currents may also occur at other units such as into output 156 of unit 106 (UNIT N). The circuitry found at the output of a conventional CMOS logic gate, as an example, includes, in addition to protection components, MOSFETs that serve to drive the output and allow it to both sink and source sufficiently high currents. It therefore represents a greater challenge to prevent exemplary leakage paths at the outputs when compared to the input leakage 120, where active input circuitry of UNIT 1 (102) typically presents an input signal with gates of MOSFETs that are inherently of very high impedance. Hence, the complexity associated with the minimal current-consumption penalty provided by the present invention for cold-sparing system configurations stems primarily from the need to minimize output leakage currents, such as output leakage current 122.

Figure 2A:
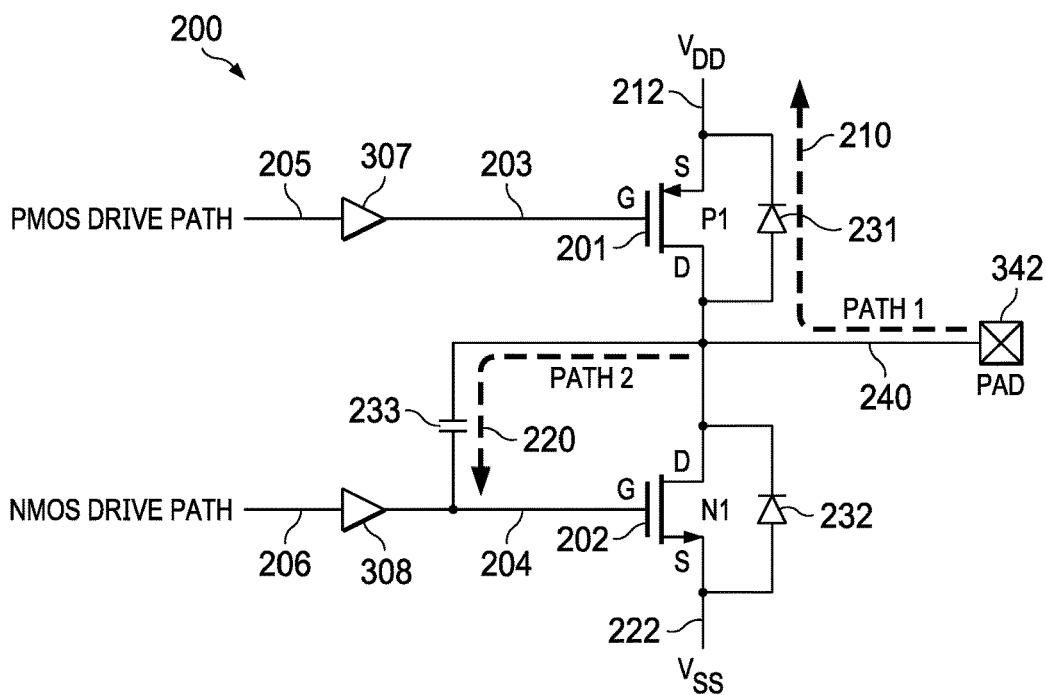
FIGS. 2A-2B are schematic diagrams of output stages of prior art CMOS circuits depicting leakage current paths in prior art cold-sparing systems.

FIG. 2A is a schematic diagram depicting the circuitry found in a typical output stage 200 of a prior art CMOS logic gate. PMOS transistor 201 (P1) is used to drive output signal 240 to a high logic level and thereby source current from supply rail $V_{DD}$ through $V_{DD}$ terminal 212, when gate terminal 203 is biased low via PMOS DRIVE PATH 205. NMOS transistor 202 (N1) is used to drive the output to a low logic level and sink current from output pad 342 associated with output 240 towards supply rail $V_{SS}$ at $V_{SS}$ terminal 222, when gate terminal 204 is biased low via NMOS DRIVE PATH 206. Buffers 307 and 308 symbolically represent drive circuitry within the PMOS and NMOS (respectively) DRIVE PATHS 205 and 206 whose outputs 203 and 204 are used to drive transistors 201 (P1) and 202 (N1). Diodes 231 and 232 each represent a parasitic body diode (or 'backgate') that is inherent to typical MOSFET transistors, associated respectively with transistors 201 (P1) and 202 (N1). Capacitor 233 represents a parasitic capacitance $C_{GD}$ associated with transistor 202 (N1). Output leakage paths that can cause undesired power dissipation in a system connected to pad 342 include dc path 210 (PATH 1) and ac path 220 (PATH 2).

Figure 2B:
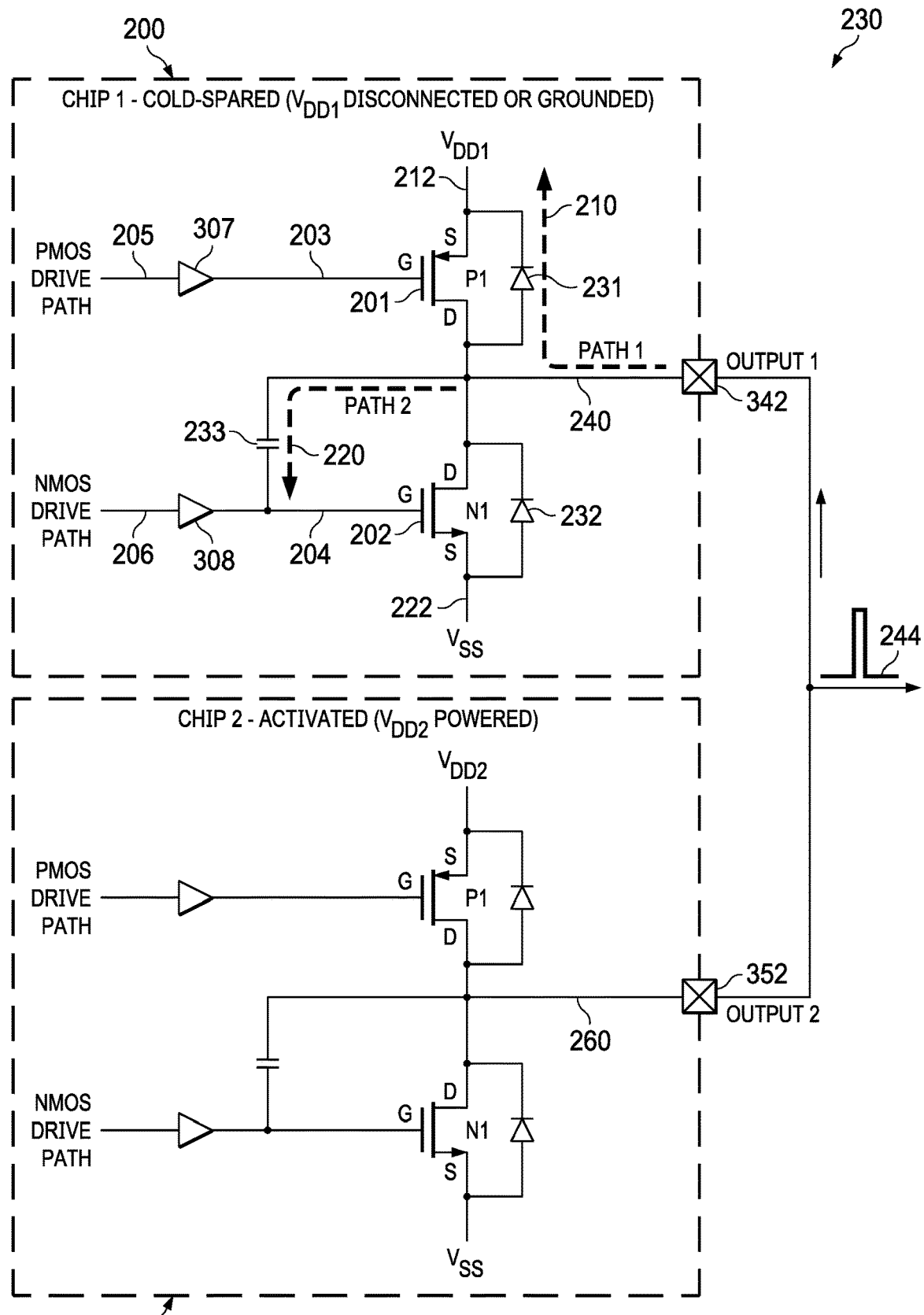

Referring now to FIG. 2B, a schematic diagram is shown of an exemplary prior art cold-sparing system 230 in which the output of a cold-spared logic gate 200 (CHIP 1) is connected to the output of an active logic gate 250 (CHIP 2). When the positive power supply rail $V_{DD}$ is grounded or in a powered off state at $V_{DD1}$ terminal 212, representing a possible configuration for shutting off circuit 200 (CHIP 1) while activating a similar circuit 250 (CHIP 2) connected in parallel with CHIP 1 (200), leakage current in path 210 (PATH 1) may originate from the CHIP 1 output 240, when forced to a high logic level by the output 260 of active circuit 250, which is connected in parallel by the connection between pad 342 (OUTPUT 1) and pad 352 (OUTPUT 2). This leakage path 210 exists regardless of the state of the PMOS DRIVE PATH 205, due to the presence of forward-biased body diode 231, and, depending on how the disabling of the $V_{DD}$ to the CHIP 1 circuit 200 is implemented, may result in wasted power consumption even when output 240 is permanently held (driven) high by circuit 250 (i.e. without any transitions in the output signal).

When transitions occur at output 240, such as in a pulsed signal 244 that is driven by circuit 250 that is connected in parallel in a cold-sparing configuration of the type shown in FIG. 1 or FIG. 2B, these transitions may find an ac (frequency-dependent) leakage path to ground that is due to activating NMOSFET N1 (202) via the parasitic capacitance $C_{GD}$ (233) that is inherent to NMOSFET 202. I.e., transistor 202 (N1) may be transiently turned on at each positive transition, resulting in a transient current flow through transistor 202. The undesired power dissipation associated with this path will thus depend strongly on the rate or frequency of transitions (number of transitions per unit time) in the signal 244 applied at output 240 from the output of circuit 250.

The present invention targets the prevention of leakage paths of both these types of signals, dc and ac, so as to avoid the typical power consumption penalty associated with cold-sparing configurations that such paths can cause. In accordance with the present invention, this goal may be achieved by placing additional components in the circuit that serve to block such paths when the circuit is shut off, but also allow for normal operation of the circuit's inputs and outputs when the circuit is activated, without requiring any static bias current or power during the cold sparing condition.

It is to be noted that the powered-down cold-spared unit, in which all possible leakage paths on all input/output ports are to be addressed, may be presented with a wide range of impedances at its power-supply input. At the extremes, if powering down the cold-spared unit is implemented via disconnecting its supply input, it will be presented with the highest possible impedance at the supply input, whereas at the other extreme, this same power supply input pin may instead be grounded. The present invention therefore accommodates all such possibilities and effectively prevents the aforementioned leakage paths for all possible power-down conditions. It should further be noted that the additional circuitry that achieves this goal in accordance with the present invention typically does not have a power supply available to it for its operation. Hence, biases that may be necessary for any of the components involved in the inhibition of leakage paths must be derived from the same active signal that is externally available at the cold-spared port that would otherwise originate an undesired leakage path.

Furthermore, in addition to the wasted power consumption that may result from the leakage path directly, there is the possibility for a high logic level that may be presented at a port of a cold-spared unit IC to bias that IC, if its power supply pin is disconnected rather than grounded, potentially resulting in additional power consumption, as well as the undesired erroneous operation of the cold-spared IC. The present invention also addresses this possibility.

FIGS. 3A through 3D are schematic circuit diagrams displaying increasingly complex designs that add components to progressively shut off more leakage paths in a CMOS output stage, leading to a complete embodiment of the present invention for a low dissipation cold-sparable output stage that later will be described in reference to FIG. 4A.

Figure 3A:
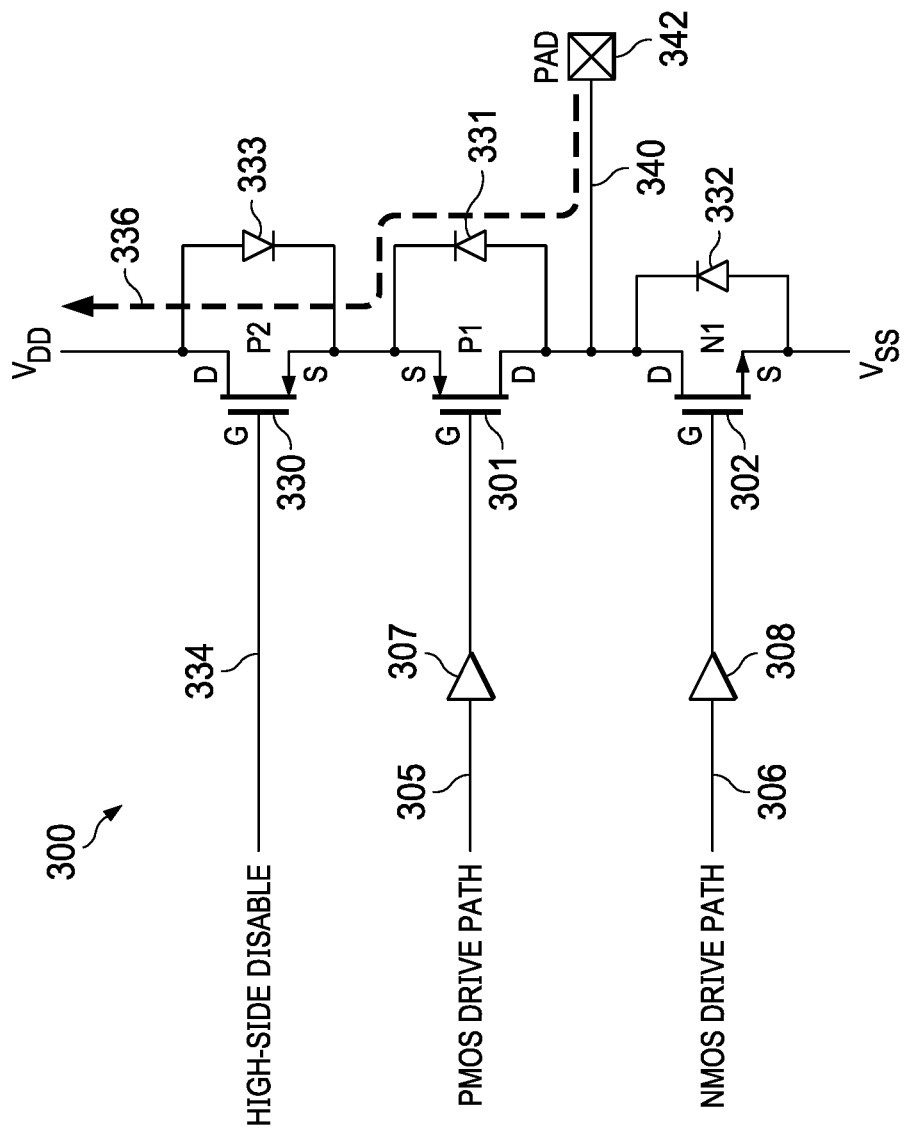
FIGS. 3A-3D are schematic diagrams of portions of a CMOS output stage showing various leakage current paths that are mitigated by the present invention.

FIG. 3A is a schematic diagram depicting an output stage 300 of a CMOS gate constructed by modifying prior art output stage 200. This first modification is implemented by adding one additional PMOS transistor 330 (P2) in series with the PMOS transistor 301 (P1, corresponding to prior art transistor 201 of the standard CMOS output stage structure). [NMOS transistor 302 (N1) (with its body diode 332) is analogous to NMOS transistor 202 (with body diode 232) in prior art output stage 200, and drive paths 305 and 306 in the modified circuit are analogous to paths 205 and 206 in the prior art.] The additional transistor 330 is turned on during normal operation (i.e. when the circuit is activated) by applying a low level HIGH-SIDE DISABLE signal at gate terminal node 334, and is turned off when the circuit is powered down (i.e. when cold-spared) by applying a high level at that node. (It will be understood throughout this description that control signals referred to herein may be configured to operate in either active-low or active-high modes simply by providing correct inverting or non-inverting control circuitry that may not be shown in the schematic diagrams, and therefore the polarities of the exemplary control signals such as HIGH-SIDE DISABLE are not limited to those described herein.) Asserting HIGH-SIDE DISABLE to turn off transistor 330 serves to block the leakage current 336 shown in the schematic diagram, which could otherwise flow from the output 340, as a result of a high logic level being applied by a parallel circuit that is active at that time, as per the explanation for path 210 (PATH 1) in reference to FIGS. 2A and 2B above. A fundamental method of the present invention connects two MOS transistors in series "back-to-back," i.e. such that their body diodes are connected with opposite polarity so as to block leakage currents that may flow through the body diodes. As a key principle of the present invention, while the leakage current 336 may flow through the body diode 331 of PMOS transistor 301 (P1), it will not be able to flow through the body diode 333 of PMOS transistor 330 (P2), which has been inserted with its drain terminal at the power supply rail $V_{DD}$ and its source terminal connected to that of transistor 301 (P1). This polarity of transistor 330 (P2) blocks current 336, shown by the dashed arrow in the figure, from flowing towards a grounded (i.e. shutdown) $V_{DD}$ rail. This direction of flow through the source-to-drain path of P2 (i.e. the transistor's channel) may be disabled by applying a sufficiently high bias to the gate terminal 334 of P2, such that $V_{GS2}$ cannot go negative, as such negative biasing would allow the channel of P2 to conduct. To achieve such biasing conditions for P2 during shutoff, the HIGH-SIDE DISABLE signal 334 may be held high whenever a high-level is applied at the output 340, originating from the active circuit connected in parallel. Since no power supply is available to the cold-spared circuit when shut off, this HIGH-SIDE DISABLE biasing may be derived from the same signal at 340 that could cause the leakage current that transistor 330 (P2) is intended to avoid.

Figure 3B:
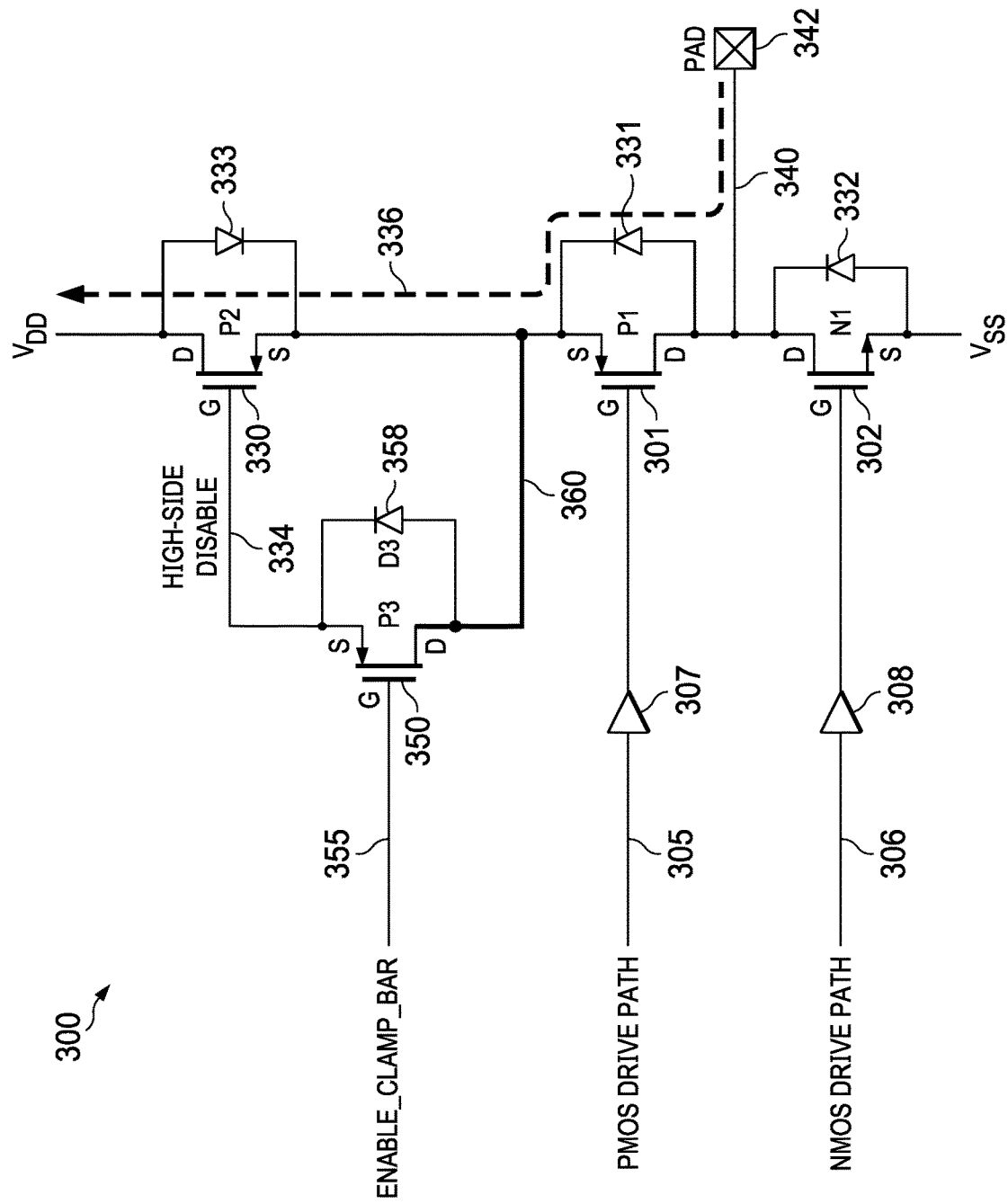

Referring now to schematic diagram FIG. 3B, the required biasing of the HIGH-SIDE DISABLE signal is derived from the externally forced output signal 340 by means of a first of two alternative embodiments. In this first embodiment of the present invention, the source terminal of transistor 301 (P1) is connected through PMOS transistor 350 (P3, with its associated body diode 358), to the gate terminal 334 of transistor 330 (P2) via connection 360. Control signal 355 (ENABLE_CLAMP_BAR) is applied to the gate of transistor 350 (P3). Transistor 350 (P3) thus serves to clamp the source terminal of transistor 301 (P1) to the gate terminal 334 of transistor 330 (P2), such that $V_{GS2}$ is held close enough to zero to prevent conduction in transistor 330 (P2), thereby blocking the path for leakage current 336.

Figure 3C:
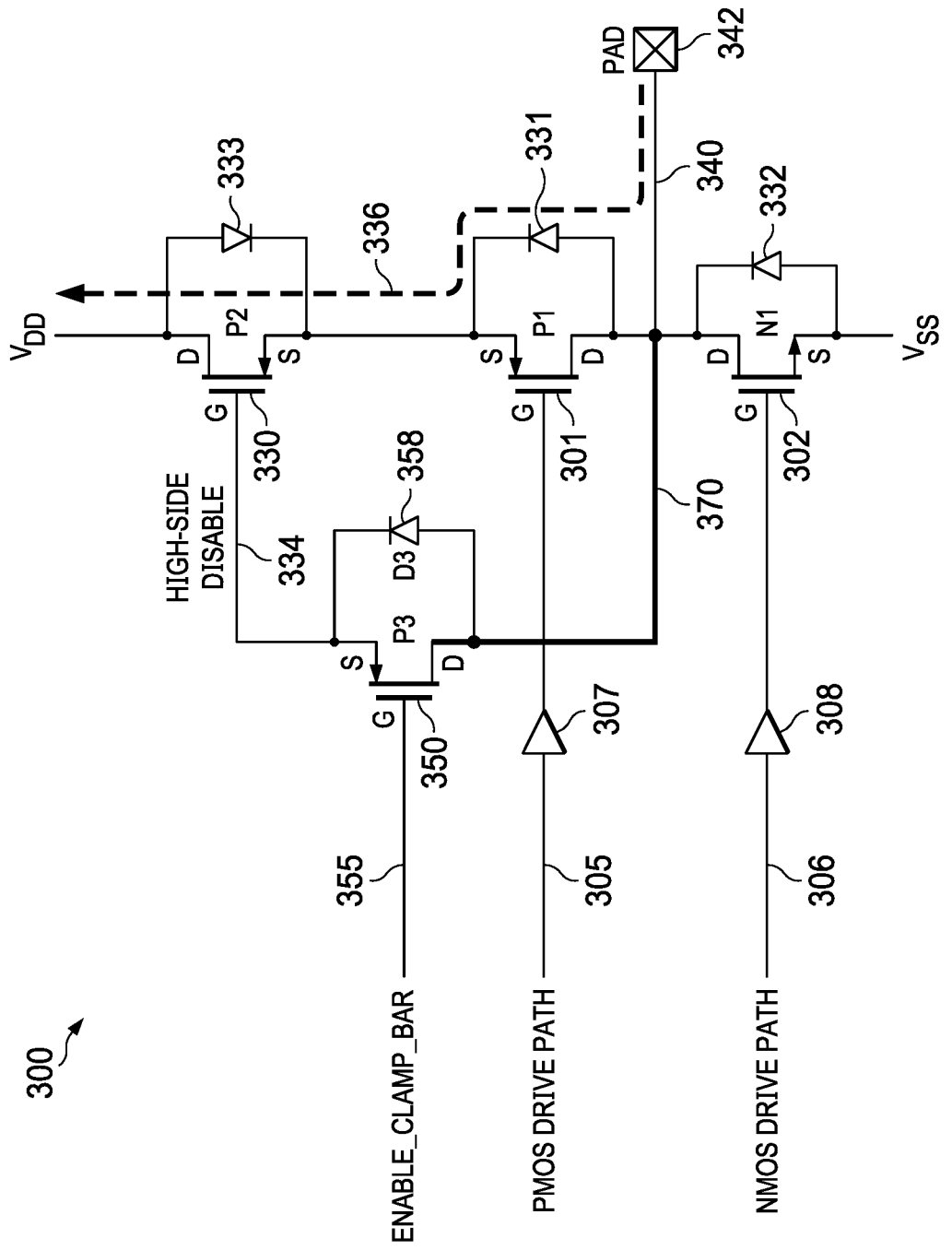

Referring now to the schematic diagram of FIG. 3C, in a second alternative embodiment of the present invention, the output node 340 is connected through PMOS transistor 350 (P3) to the gate terminal 334 of transistor 330 (P2) via alternative connection 370 from output 340 to the drain of transistor 350 (P3). Transistor 350 (P3) thus serves to clamp the output node 340 to the gate terminal 334 of transistor 330, such that $V_{GS2}$ is held negative when the output 340 is forced to a high level, due to the voltage drop on body diode 331 of transistor 301 (P1). This further ensures that transistor 330 (P2) will be in cutoff and will thereby effectively block leakage current path 336. This connection 370 may be advantageous over connection 360 shown in FIG. 3B by providing a stronger clamping effect at transistor 330 (P2), and is therefore the version that is shown in subsequent FIGS. 3D through 4E. For this to be effective, the control signal 355 (ENABLE_CLAMP_BAR) applied to the gate of transistor 350 (P3) may be held high during the normal operation of the circuit, (i.e. when it is active), at which time the $V_{DD}$ supply is available to it, and may be set to a low level when in power-down (i.e. cold-spared). Such operation of ENABLE_CLAMP_BAR may be ensured by power-on-reset (POR) circuitry (not shown) in the absence of a supply voltage, or may be controlled externally; for example, a master controller (also not shown) such as a microcontroller could be used to coordinate POR and/or shutdown-related activities.

Figure 3D:
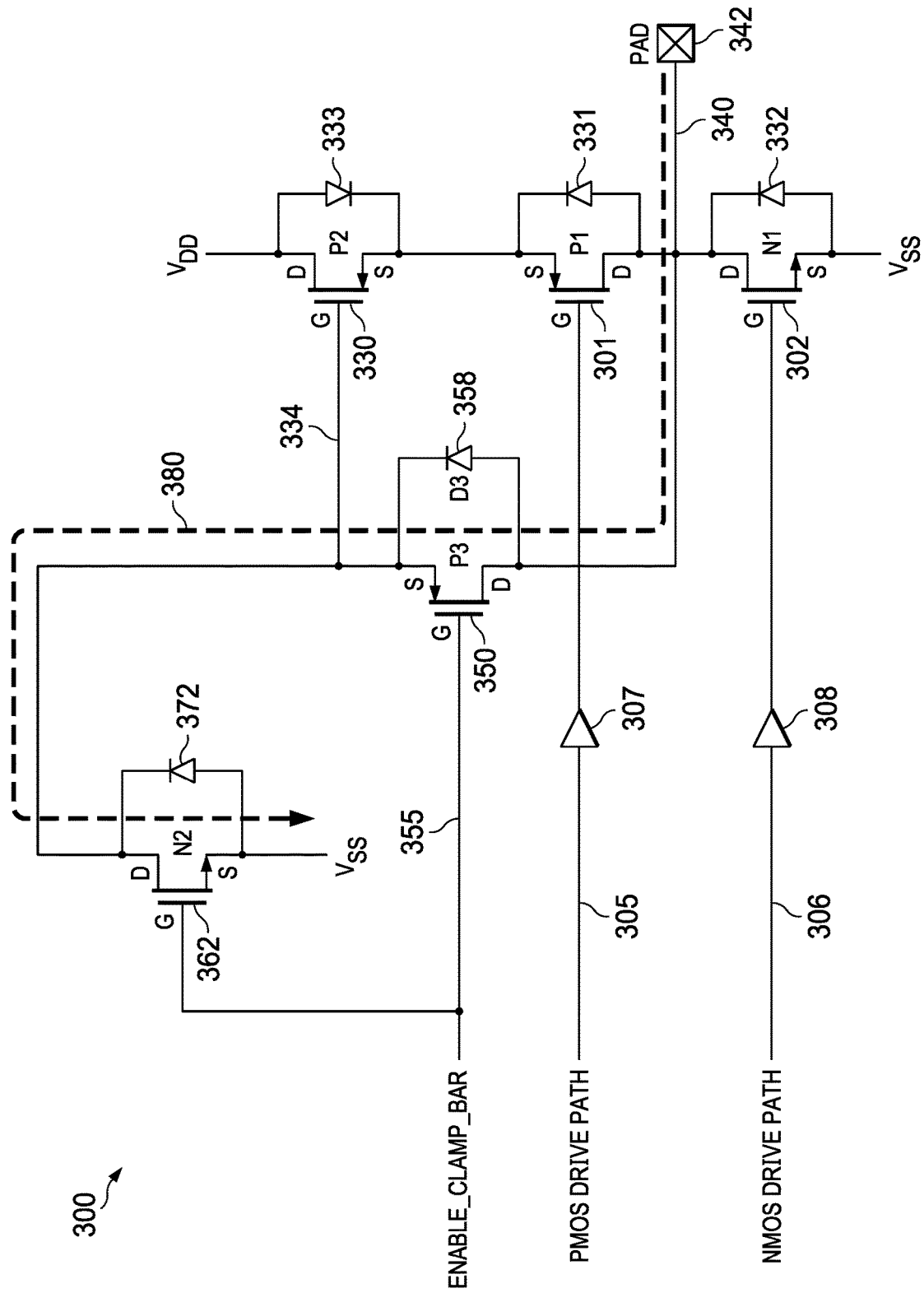

In addition to disengaging the gate 334 of transistor 330 (P2) from the output node 340 during normal operation (i.e. when the circuit is powered and activated), there remains a need to bias node 334 low in order for the channel of PMOS transistor 330 (P2) to conduct and allow the high-side portion of the output stage of the circuit to drive its output node 340. Referring now to FIG. 3D, this may be achieved by adding NMOS transistor 362 (N2, with its associated body diode 372), to be activated by the same control signal 355 (ENABLE_CLAMP_BAR), which is set to high level to disengage the output 340 from the gate of transistor 330 (P2) in order to allow it normal operation. However, when the circuit is active and its output 340 is to be driven high, another new leakage path 380 has been created between the output 340 and $V_{SS}$, which is allowed by body diode 358 (D3) of transistor 350 (P3) in series with the channel of transistor 362 (N2), which is turned on due to the high level at ENABLE_CLAMP_BAR node 355.

Figure 4A:
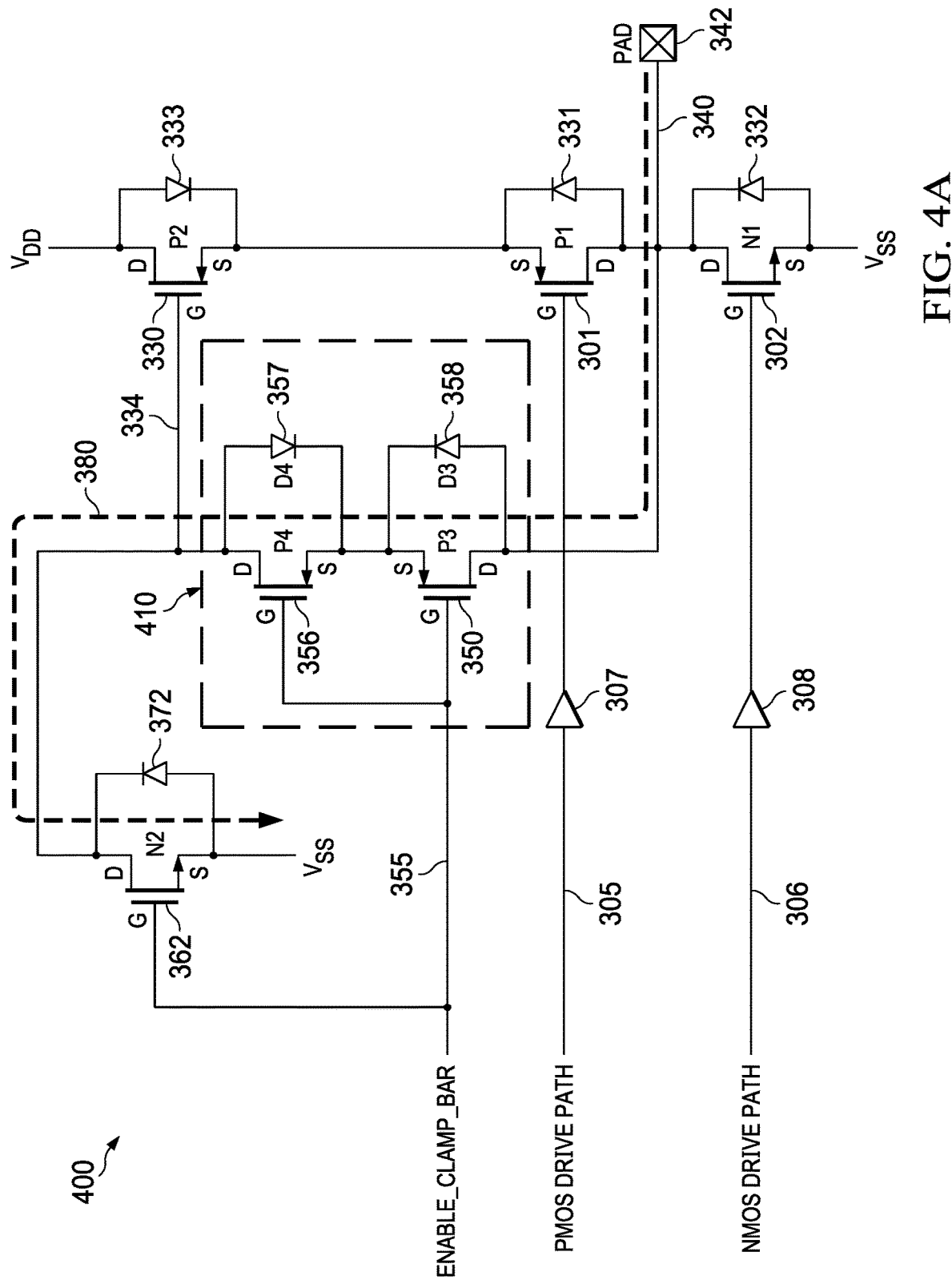
FIG. 4A is a schematic diagram of an output stage in accordance with an embodiment of the present invention.

FIG. 4A is a circuit schematic diagram depicting an embodiment of a cold-sparable output stage 400 that provides a comprehensive solution addressing the problem of this new leakage path 380. This embodiment is suitable for use in dc or low-frequency systems, i.e., systems exhibiting relatively infrequent transitions on the outputs of active units in parallel with this circuit in a cold-sparing system. The solution for blocking leakage path 380 is obtained via the insertion of PMOS transistor 356 (P4), configured such that its body diode 357 (D4) is placed back-to-back with the body diode 358 (D3) of PMOS transistor 350 (P3), thereby blocking current flowing in that path 380.

The back-to-back arrangement 410, placing the channel of transistor 356 (P4) in series with that of transistor 350 (P3), while their respective body diodes 357 (D4) and 358 (D3) are back-to-back and thereby do not allow current flow through them, follows the same principle employed when placing the channel of transistor 330 (P2) in series of that of transistor 301 (P1), as described previously with reference to FIG. 3A. During normal operation of circuit 400 (i.e. when not cold-spared), by applying the ENABLE_CLAMP_BAR control signal 355 (i.e. setting it to a high logic level), transistor 362 (N2) conducts and holds node 334 low, allowing transistor 330 (P2) to conduct and facilitate normal operation of the output stage comprising transistors 302 (N1) and 301 (P1), while transistor 350 (P3) is switched off and blocks the output signal present at node 340 from reaching node 334. When cold-spared, in the absence of the power supply the ENABLE_CLAMP_BAR signal 355 is naturally set low. In such a powered-down state, when an output signal is forced onto node 340 from an active circuit connected in parallel, circuit 410 is enabled and clamps node 340 to 334, thereby ensuring that during instances when the output 340 is forced high, transistor 330 (P2) will be shut off (since this PMOS transistor would need its gate to be biased below its source node for its channel to conduct), thereby ensuring that path 336 (shown in FIG. 3C) is also interrupted and leakage current through it is blocked.

FIGS. 4B through 4E show detailed schematic diagrams of further embodiments of CMOS cold-sparable output stages that incorporate an additional feature of output tri-stating, which allows the output to be placed in a high-impedance state like an input when deactivated. Such a feature is often required for ports that may be used as both outputs and inputs, as is the case in ICs that serve as bidirectional data transceivers. The tri-state capability is also commonly used when multiple outputs share a common bus, as is often employed with multiple memory ICs that are combined to serve as a larger memory module.

Figure 4B:
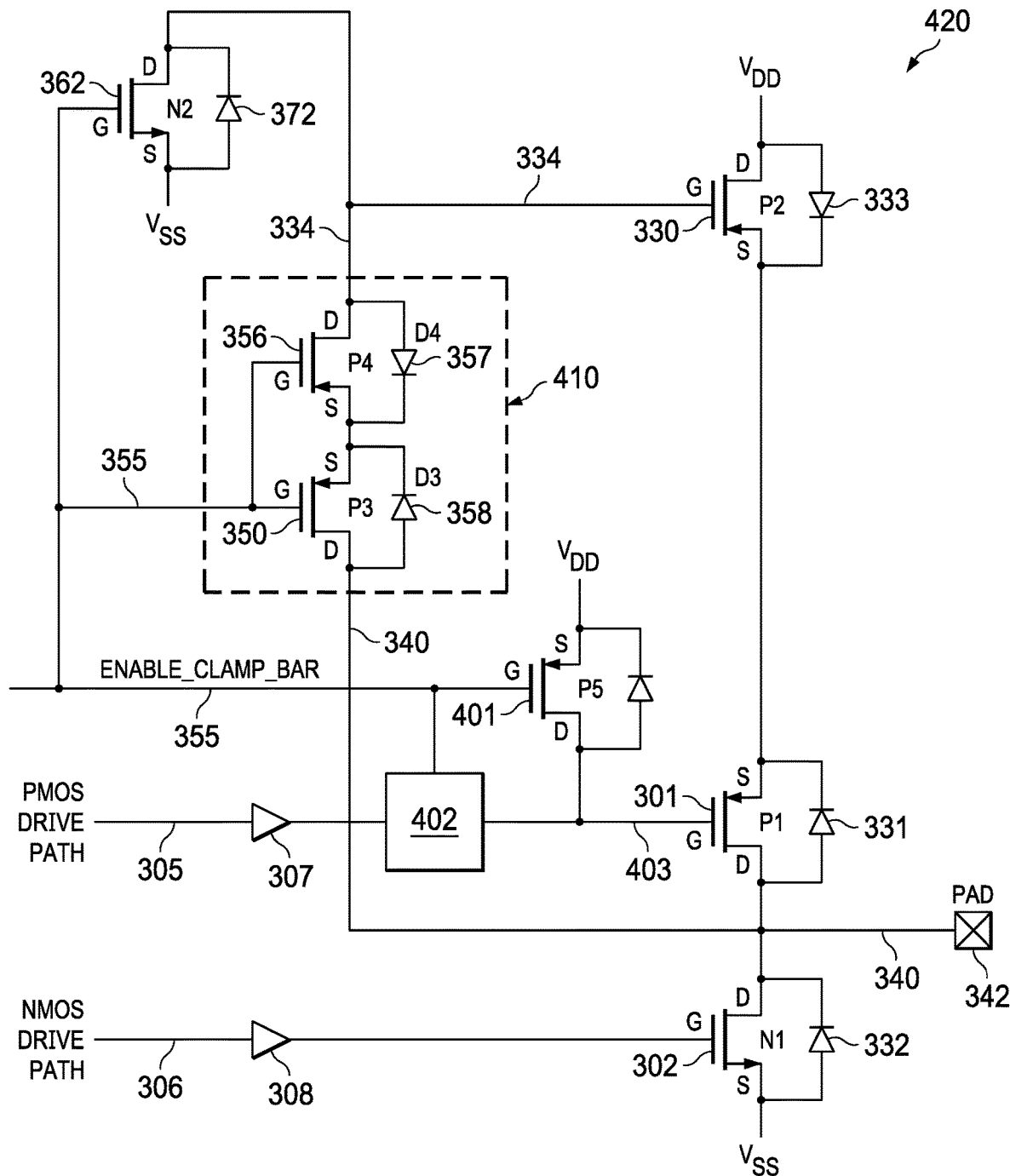
FIG. 4B is a schematic diagram of an output stage that includes a tri-state capability in accordance with another embodiment of the present invention.

Referring now to the schematic diagram of FIG. 4B, in accordance with one embodiment of the present invention, a cold-sparable tri-state capable output 420 is depicted. Tri-state capability is achieved by disengaging PMOS transistor 301 (P1) via the use of PMOS transistor 401 (P5), which is controlled by the common ENABLE_CLAMP_BAR signal 355. As previously explained, the ENABLE_CLAMP_BAR signal 355 may be internally set to a high level in order to disengage the output 340 from gate 334 of PMOS transistor 330 (P2), thereby allowing the gate to function normally in its active mode. When intentionally set internally to a low level (i.e. not as a result of a power shutdown), the ENABLE_CLAMP_BAR signal 355 serves to enable PMOS transistor 401 (P5), due to the negative $V_{GS}$ this low level will create, and thereby will pull the gate of PMOS transistor 301 (P1) such that P1 will be in cutoff, allowing the output 340 to float and be driven by another circuit that is sharing that output node 340 through pad 342. Preferably, in this instance the NMOS DRIVE PATH 306 is set to ensure that the gate of NMOS transistor 302 (N1) is held low, such that the channel of transistor 302 (N1) will not conduct and thus will not load the output node 340.

As part of implementing a low-dissipation tri-state capability, in order for PMOS transistor 401 (P5) to be able to pull up gate 403 of transistor 301 (P1) without conflicting with the output level dictated by PMOS DRIVE PATH 305, additional logic, including a transmission gate (TG) based switching circuit in block 402, is inserted in that path, as shown in FIG. 4B, allowing the penultimate stage of the PMOS DRIVE PATH 305 to be disengaged from node 403.

Figure 4C:
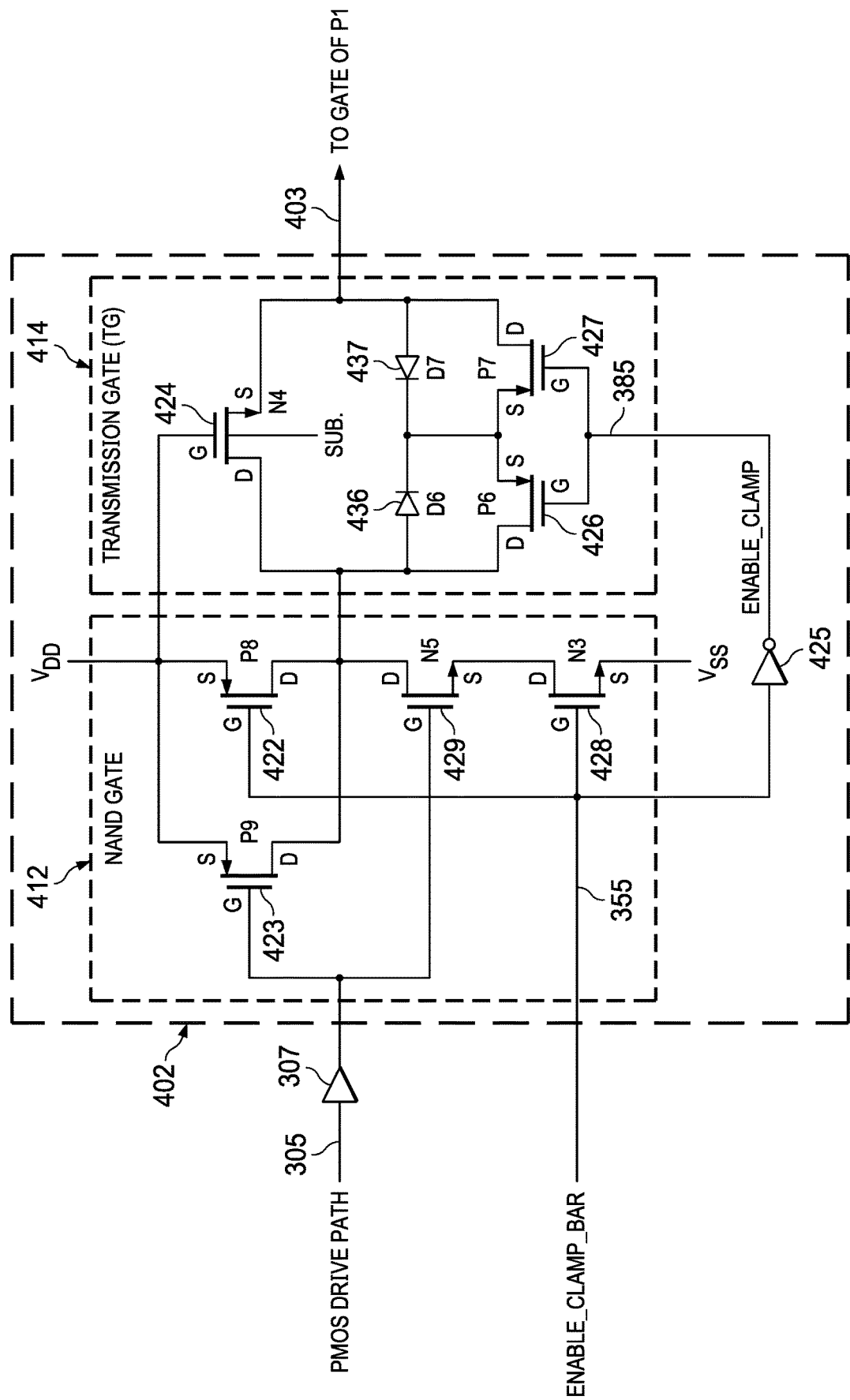
FIG. 4C is a schematic diagram showing the detailed internal circuitry of block 402 in FIG. 4B.

FIG. 4C is a schematic circuit diagram showing the internal structure of the transmission-gate (TG) based switching circuit represented by block 402 in FIG. 4B. This circuit block includes a transmission gate (TG) 414 that separates the penultimate high-side driver from the final stage when the circuit output is being tri-stated. The TG 414, based on transistors 424 (N4), 426 (P6) and 427 (P7), is used to disengage the penultimate stage of the PMOS DRIVE PATH 305, represented here by buffer 307, from the gate terminal 403 of PMOS transistor P1 (301) when its control signal ENABLE_CLAMP 385, generated here schematically by inverter 425, is set to high. (In other embodiments, ENABLE_CLAMP signal 385 alternatively may be derived or generated separately from elsewhere within circuit 420 or externally from outside of circuit 420.) NAND gate 412 is used to generate control signals for TG 414 while passing the PMOS drive signal 305 through TG 414 to node 403 (gate of P1). Disengaging stage 307 from the gate 403 of transistor 301 (P1) allows PMOS transistor 401 (P5) shown in FIG. 4B to force a high level at node 403 (gate of P1) and thereby shut off PMOS transistor 301 (P1) to facilitate a high-impedance state (tri-state) at output 340 of circuit 420, while not allowing a path back into the output of NAND gate 412.

It is to be noted that a conventional TG has the gates of both its NMOS and PMOS transistors biased by the control signal, but uses inverted logic (i.e. when the PMOS gate is biased low, allowing its channel to conduct, the NMOS channel is biased high, so that its channel could conduct as well). Contrarily, in one embodiment of the present invention, the gate of NMOS transistor 424 (N4) in TG 414 may be permanently connected to the supply rail $V_{DD}$. Consequently, this transistor 424 (N4) conducts while the device is powered, allowing the output of NAND gate 412 to be connected to the gate node 403 of PMOS transistor 301 (P1), such that both the normal logic operation and the tri-state mode for this device are supported. Additionally, when the device is cold-spared and its power is absent, such that transistor 424 (N4) does not conduct (and does not allow a leakage current path from node 403 back into the penultimate state 307 via NAND gate 412), PMOS transistors 426 (P6) and 427 (P7), having their body diodes 436 and 437 (respectively) back-to-back, also do not allow such leakage path, thereby ensuring that transients occurring at output node 340 (as shown in FIG. 4B), which could reach node 403 through the gate-to-drain parasitic capacitance $C_{GD}$ of transistor 310 (P1), do not find a path to the supply rails, which might lead to undesired loading of ac signals during cold-sparing. Thus, the TG 414 effectively cuts off paths from transistor 401 (P5 in FIG. 4B) back to the penultimate stage 307, when transistor 401 (P5) operates to pull the gate 403 of transistor 301 (P1) high while the output is in the tri-stated condition.

A mechanism through which transients at output 340 may cause undesired powering of the cold spared device is through charging of $V_{DD}$ decoupling capacitance that may not be grounded (i.e. power supply disconnected). This might be possible through the body diode (not shown) of PMOS transistor 422 (P8) in the NAND gate 412 shown FIG. 4C. Since this same capacitively coupled transient would also couple to the gate of the PMOS transistors 426 (P6) and 427 (P7) in TG 414, these transistors will be turned off and cut that path off. Thus, in the switching circuit 402 of the present invention, the $V_{DD}$ rail is kept completely off, and will not be biased during cold sparing as a result of transients that are present at output 340, thereby allowing the $V_{DD}$ rail to be used to bias the gate of NMOS transistor 424 (N4) in TG 414.

Still referring to FIG. 4C, PMOS transistor 426 (P6) is a novel feature in transmission gate 414 (TG) according to the principles of the present invention. A conventional TG structure would have only PMOS transistor 427 (P7). PMOS transistor 426 (P6) is added in series, according principles discussed previously e.g. in regard to the structure of the back-to-back arrangement 410, in order to cut off the possible leakage path through the body diode 437 (D7) of transistor 427 (P7).

During normal operation of the output stage (i.e. when powered, functioning, and not cold-spared), NAND gate 412, comprising transistors 422 (P8), 423 (P9), 428 (N3) and 429 (N5), produces a low level at the gate terminal node 403 of output transistor 301 (P1) when output node 340 of the device is to be driven high, or a high level at that node when the output 340 is to be driven low. It is to be noted that for the output 340 to be driven high, requiring node 403 to be low (for PMOS transistor 301 to be turned on), both the ENABLE_CLAMP_BAR signal 355, as well as the output of the penultimate stage 307, need to be set high. This function may be realized by the NAND logic 412 shown in FIG. 4C, which produces a low level at its output, i.e. the node connecting the drains of transistors 429 (N5) and 422 (P8), to the input of TG 414, connecting the drains of transistors 424 (N4) and 426 (P6), only when both of the inputs of NAND 412 (PMOS DRIVE PATH and ENABLE_CLAMP_BAR) are set high.

It will be understood by those skilled in the art that the exemplary circuit configuration shown as NAND gate 412 in FIG. 4C may be replaced by other circuit implementations or logic, so long as these alternate implementations produce the proper polarity of inverted or non-inverted ENABLE_CLAMP signals to operate TG 414 such that TG 414 passes the proper polarity of the PMOS DRIVE PATH signal 305 to gate 403 of transistor 301 during normal powered operation, and also such that TG 414 is permitted to block leakage paths back into penultimate driver stage 307 either when cold-spared or when output 340 is placed into tri-state mode.

Figure 4D:
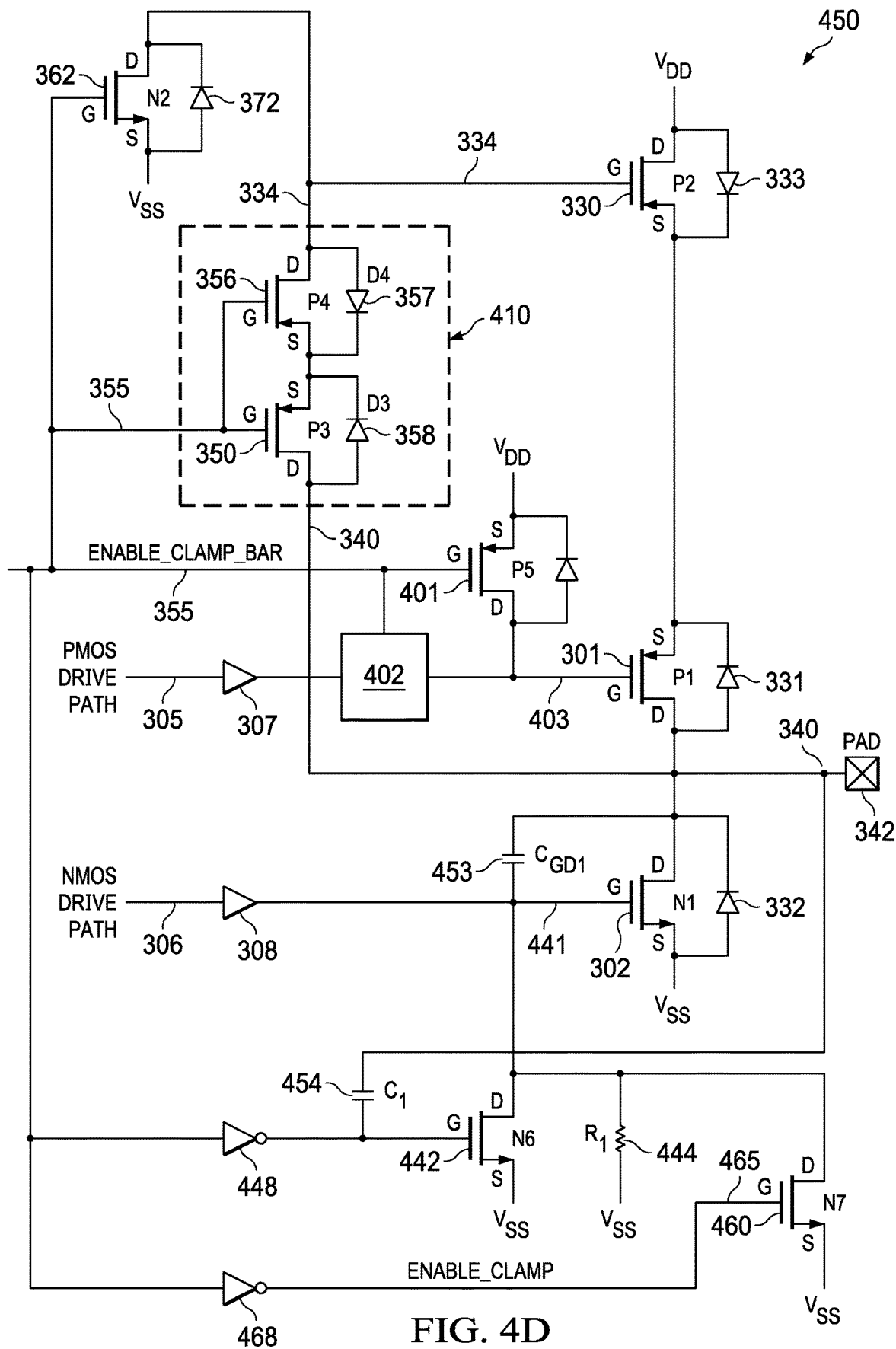
FIG. 4D is a schematic diagram of a tri-state output stage in accordance with another embodiment of the present invention.

Referring now to FIG. 4D, a schematic diagram is shown of a cold-sparable "transition-proof" tri-state output circuit 450 that maintains low leakage in the presence of transitions at its output when cold-spared. In other words, output circuit 450 is insensitive to externally applied transitions with regard to its low leakage properties. In particular, this circuit mitigates a leakage path from output 340 to the $V_{ss}$ rail through NMOS transistor 302 (N1) that can occur due to transitions at output 340 arising from a parallel circuit asserting these transitions at pad 342 while circuit 450 is powered down, i.e. in a cold-spared state. This leakage path is addressed by the addition of the circuitry shown below transistor 302 (N1) in FIG. 4D, comprising capacitor 454 ($C_1$), NMOS transistor 442 (N6), NMOS transistor 460 (N7) and resistor 444 ($R_1$).

The leakage path due to transitions at pad 342 may result from such transitions activating NMOS transistor 302 (N1) through the parasitic capacitance between its gate terminal 441 and its drain terminal (at node 340), represented in the schematic diagram as capacitor 453 ($C_{GD1}$). Transitions at node 340, through this capacitance, can activate the gate terminal of transistor 302 (N1), thereby allowing the channel of transistor 302 (N1) to transiently conduct and thereby load node 340 to ground. This is also shown in FIG. 2A and FIG. 2B, where the path for the transition activating N1 via its parasitic capacitance 233 is indicated by path 220 (PATH 2). Since this turn-on of transistor 302 (N1) occurs only at the instances of transitions, the average current and corresponding wasted power consumption are frequency dependent. In accordance with an embodiment of the present invention, to prevent such transitions from resulting in undesired current from node 340 through the channel of transistor 302 (N1) to $V_{ss}$, the gate terminal 441 of transistor 302 is tied to ground at the instances of these transitions by using the transitions to activate additional NMOS transistor 442 (N6) through capacitor 454 (C1), the capacitance value of which is selected such that the conduction duration of transistor 442 (N6) will last at least as long as the transitions that would otherwise turn on transistor 302 (N1) via parasitic capacitance 453. Transistor 442 (N6) is also driven directly or indirectly by ENABLE_CLAMP, an inverted form of the ENABLE_CLAMP_BAR signal as represented schematically by inverter 448. To allow the output stage of circuit 450 to be properly tri-stated while it is activated (i.e. powered), an additional NMOS transistor 460 (N7) is used to tie down gate terminal 441 of transistor 302 (N1) when the control signal ENABLE_CLAMP at the gate terminal 465 of transistor 460 is high, i.e. when the ENABLE_CLAMP_BAR control signal at node 355, at the input of inverter 468, is low ("BAR" notates a logic inversion, or active low). Again, note that the ENABLE_CLAMP signal may be derived or generated from elsewhere either within or external to circuit 450, and inverter 468 is merely a schematic representation of this function. Resistor 444 ($R_1$) provides a resistive path to ground that holds the gate of transistor 302 (N1) low during initial powering on of circuit 450. In order to minimize the current consumption penalty in resistor 444 when the output of circuit 450 is to be set low (i.e. when node 441 is high, resulting in current through this resistor), a high value for resistor 444 may be preferred.

Referring now to 4E, a schematic diagram of a tri-state capable split complementary output circuit 490 according to another embodiment of the present invention is shown. In this embodiment, the high-side and low-side portions of the tri-state output circuit 450 shown in FIG. 4D have been electrically disconnected from each other and their respective output signals (high-side output 340 and low-side output 341) brought out to a separate respective high-side pad 342 and a low-side pad 343. Such a separated complementary output is useful in a variety of power applications, and in particular for drive circuits in which different drive conditions may be desirable for the high-side and low-side inputs connected to outputs 340 and 341. For example, different polarity inputs may use input devices whose performance might be optimized by independent tailoring of their drive currents, or of their rise and fall times. Independent control of PMOS drive path 305 and NMOS drive path 306 allows a delay or timer to be used in power applications to prevent both of the split outputs 340 and 341 from being turned on simultaneously, and for fastest operation, a complementary latch or gate drive having differential delay can be used to drive PMOS and NMOS paths 305 and 306. Examples of applications in which such a split complementary output may be used include switching or commutating high voltages and/or high currents, such as in H-bridges or half-bridges for motor drivers, load switches, in distributed power systems, and as gate drivers for Si power FETs or high-voltage FETs in silicon carbide (SiC) or gallium nitride (GaN) technology.

Figure 4E:
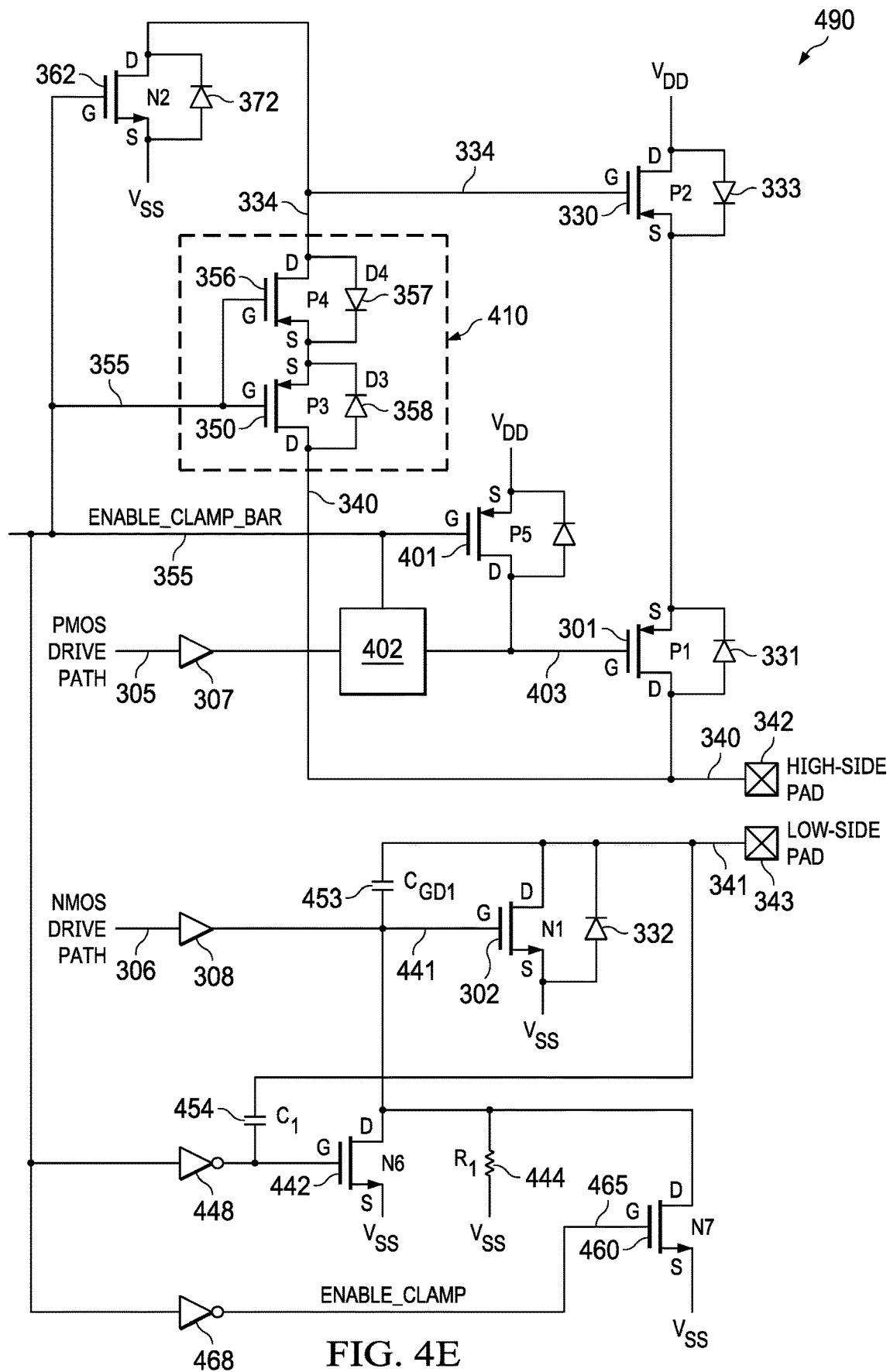
FIG. 4E is a schematic diagram of a split complementary output in accordance with another embodiment of the present invention.

In the embodiment shown in FIG. 4E, apart from the connection changes associated with separating the high-side and low-side outputs, split complementary output 490 is illustrated as having all the same circuitry as the transition-proof tri-state output 450 shown in FIG. 4D. However, it will apparent to those skilled in the art that the same techniques can also be applied to provide split complementary outputs in conjunction with the circuits shown in FIG. 4A (output stage 400) or FIG. 4B (output stage 420).

Figure 5:
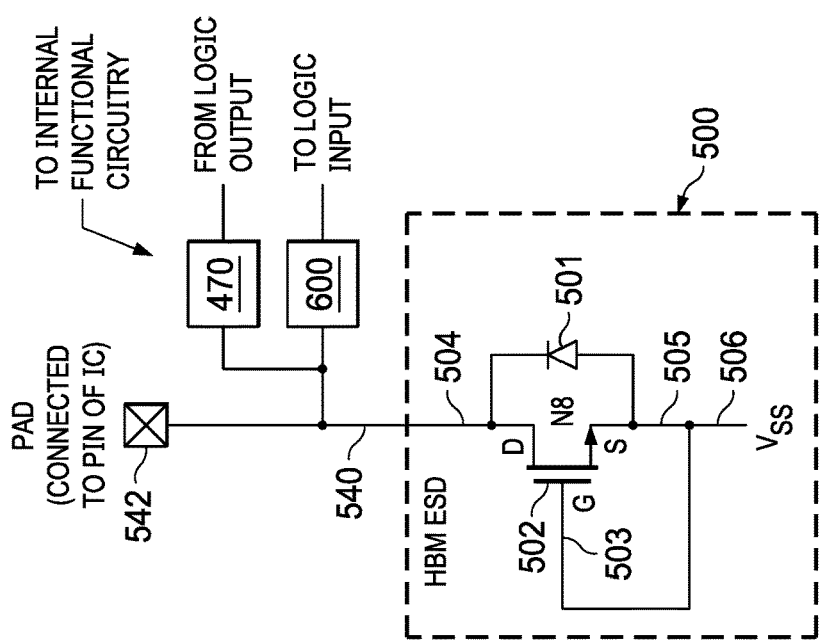
FIG. 5 is a schematic diagram of HBM ESD protection circuitry for use on input and output ports of an IC.

Referring now to FIG. 5, a schematic diagram for a human-body model (HBM) electrostatic discharge (ESD) protection circuit 500 according to the present invention is shown. This circuit addresses potential current paths into the primary ESD protection circuitry of a cold-spared device that may originate from activity on the input/output ports of an active device connected in parallel. Conventional ESD protection circuitry is commonly based on the use of clamping diodes between the IC pin or pad being protected and the supply rails. In the embodiment of the present invention shown in FIG. 5, conventional ESD protection circuitry based on clamping diodes has been replaced by a single NMOS transistor 502 (N8), having inherent body diode 501, that is connected only between the IC pin/pad being protected 542 and the ground terminal $V_{ss}$ 506, i.e. without any connection to the positive supply rail. In accordance with the present invention, gate 503 and source 505 terminals of transistor 502 (N8) are both connected to the negative supply rail 506 ($V_{SS}$ or ground), while its drain terminal 504 is connected to the (pin or) pad 542, thereby providing that pad (which may represent an IC's physical boundary) protection against excessive voltages of both positive and negative polarities. This structure is intended, at minimum, to absorb and withstand ESD events that are specified according to the widely used human-body model (HBM), which defines electrical circuits and signals that simulate ESD events similar to those created when handling an IC without being discharged of naturally occurring charges on the human body. This protection circuit 500 is therefore generally referred to here as the HBM ESD circuit. Within it, the NPN structure of junctions that is inherent to the NMOSFET 502, through a breakdown mechanism, serves to clamp to ground terminal 506 excessively high voltages that may appear instantaneously at input/output pad 542 and could potentially harm the internal functional circuitry (whether an input, output or bidirectional port) connected at 540 and accessible externally through pad 542. At the same time, body diode 501 of transistor 502 (N8) serves to clamp to ground 506 any negative voltages, even as low as a junction voltage, that may be applied externally onto pad 542, thereby protecting the internal functional circuitry from any harm that such negative voltage can cause. While these two separate clamping paths effectively serve to protect the device's internal circuitry that is connected to that input/output port, neither of them creates any loading of that port when the internal functional circuitry is active and may assert a high logic level at node 540, or when the device is cold spared and may experience an externally forced high logic level through the IC's pad 542. This is because the allowed logic levels applied externally are within the range of the supply rails, for which these two clamping paths are not activated and present a very high impedance. Driver 470 shown in FIG. 5 represents an exemplary output circuit of one of the types 400 (shown in FIG. 4A), or tri-state types 420 (shown in FIG. 4B) or 450 (shown in FIG. 4D). Block 600 represents input circuitry that may be present at node 540 if it is used as an input port, in which case driver 470 may be absent, or as a bidirectional input/output port, in which case driver 470 may be tri-stated whenever the port is used as an input. Input circuitry 600 may typically be of the type to be described next in reference to FIG. 6, which includes a secondary ESD protection circuit.

Figure 6:
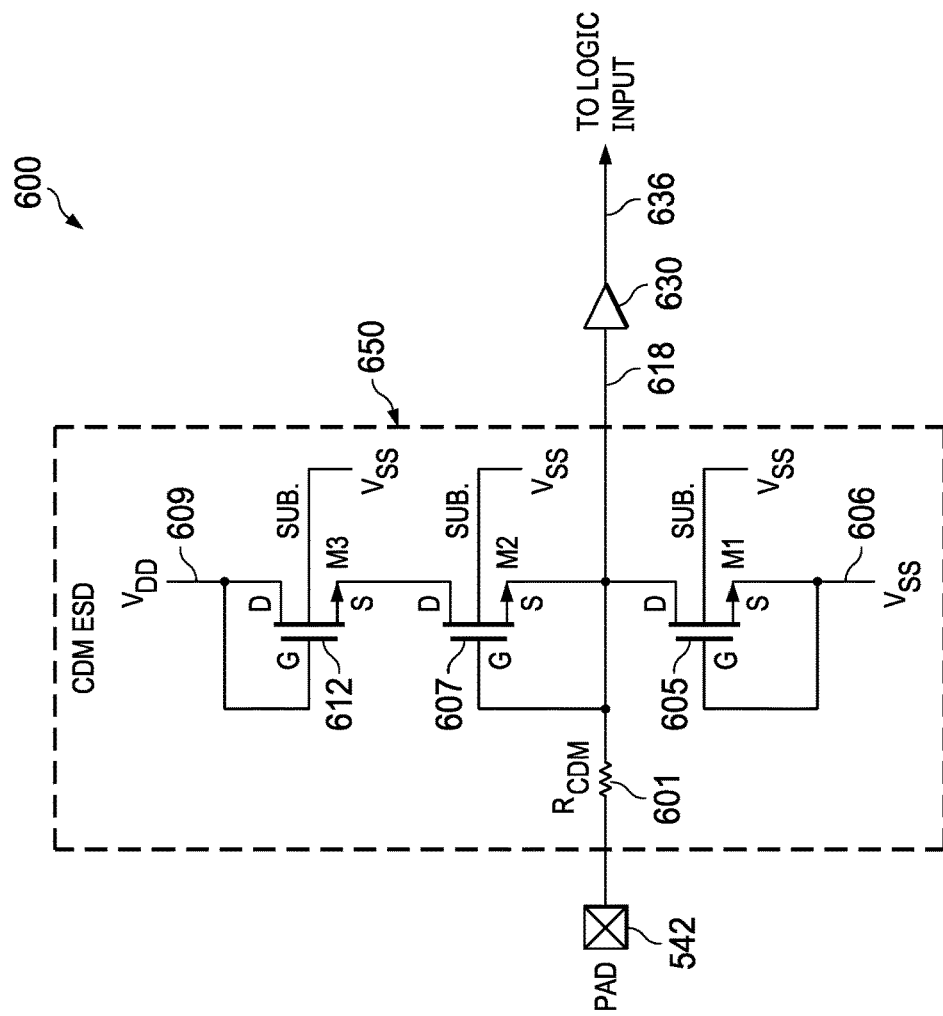
FIG. 6 is a schematic diagram of CDM ESD protection circuitry that for use on input ports of an IC.

Referring now to FIG. 6, a schematic diagram of input circuitry 600 is shown that includes circuit 650 for additional ESD protection, addressing another type of ESD mechanism, categorized as the charged-device-model (CDM) ESD. Contrary to the externally originated HBM ESD, CDM ESD originates from within an IC device and may find a discharging path through one of the IC's pins during its assembly/handling, thereby potentially damaging a transistor's gate oxide. Therefore, in addition to the aforementioned HBM ESD protection circuitry shown in FIG. 5, secondary CDM ESD protection circuitry (also called "fail-safe") is often provided at all IC input ports, where a transistor's gate may be in the path of the associated ESD impulse. I.e., CDM ESD 600 may be used in conjunction with HBM ESD 500 connected at the same pad 542. In accordance with the present invention, this protection circuitry may be adapted to avoid any possible current paths that could be experienced in the device when it is cold-spared. Hence, while a conventional solution for CDM ESD protection might comprise only NMOS transistors 605 (M1) and 607 (M2) shown in FIG. 6, in an embodiment of the present invention, node 618, which is in contact with the gates of MOSFETs found at the input of internal circuitry represented schematically by buffer 630 (connected to further internal circuitry through connection 636), is separated from the $V_{DD}$ power supply rail 609 by an additional NMOS transistor 612 (M3). This serves to interrupt a possible leakage path from node 618 towards $V_{DD}$ when the device is cold-spared (i.e. $V_{DD}$ is potentially grounded). Resistor 601 ($R_{CDM}$) is a series resistor sized to limit the current that the CDM ESD protection circuit conducts during a CDM event. NMOS transistors 605 (M1), 607 (M2) and 612 (M3) are preferably non-isolated transistors, having their body (backgate) connections tied to the substrate at potential $V_{SS}$ (node 606), as also shown in FIG. 6.

Figure 7:
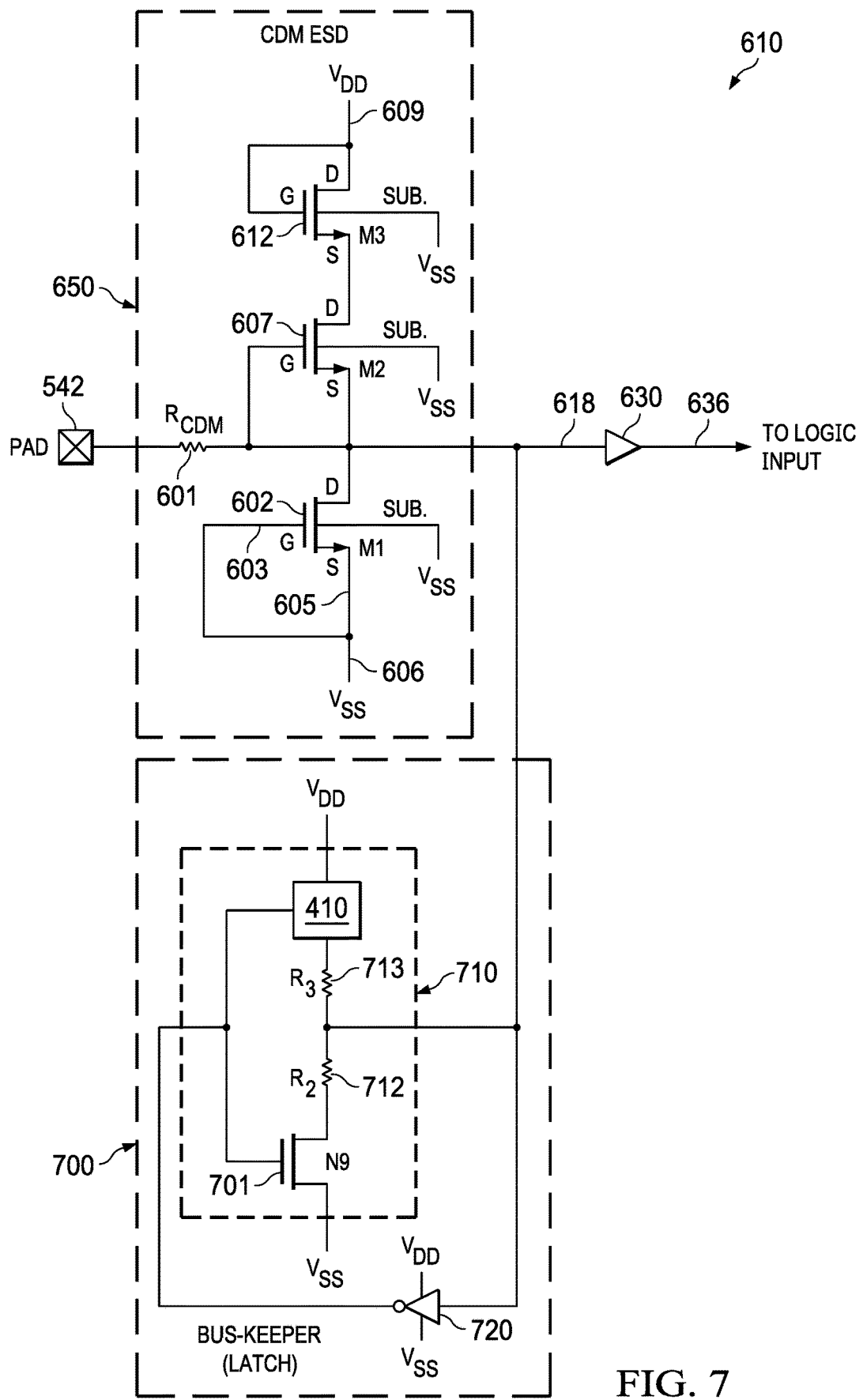
FIG. 7 is a schematic diagram of bus-keeping circuitry that may be used to latch an input logic level in accordance with another embodiment of the present invention.

The schematic diagram of FIG. 7 shows an embodiment of an input 610 having optional cold-sparable bus-keeper circuitry 700, which may be optionally connected at node 618 (shown in FIG. 6 and FIG. 7) to add the functionality of an input latch. Such an optional feature allows the input 542 to be left floating (which is otherwise not recommended in conventional CMOS gate inputs) as the input level at node 618 is driven by the output of inverter 710. Back-to-back inverters 710 and 720 act as a bistable latch that essentially stores a single bit representing the last logic level input asserted at pad 542.

Resistors 712 ($R_2$) and 713 ($R_3$) isolate CMOS inverter circuit 710 from the supply rails, thereby allowing an externally fed logic level to dominate node 618 and thereby invert the logic level present there. For example, when node 618 is driven high by inverter 710, for which inverter 720 will assert a low level at its output, an exemplary buffer 630 representing internal circuitry will assert a high level at output 636, where this signal may be provided to additional circuitry that may perform e.g. a logic function or level-translation. In such a state, if the input at pad 542 were to be left floating, as a result of it being connected to a tri-stated input or for whatever other reason, no change in the internal state observed at node 636 will occur. This will also be the case if the same level, i.e. a high level in this example, were to be asserted at the pad 542. However, if a low level input were to be asserted at pad 542, this would force node 618 to a low level, while causing a current path through resistor 713 ($R_3$), with the current limited to a value that corresponds to the ratio between the positive supply rail and the value of this resistor. This low level will not only appear at output 636, but will also be inverted by inverter 720, which will in turn be inverted again by inverter 710, thereby latching this low level (i.e. toggling this single-bit memory cell's contents from a '1' to a '0'). In this state, if the low level were to be removed from pad 542, the level at node 618, and consequently also at node 636, will remain at a low level (i.e. '0') until a high level is asserted at pad 542, at which time a similar toggling operation will occur involving current flowing into the input and into the output of inverter 710 and resistor 712 ($R_2$). This memory feature for an input is referred to as a "bus-keeper" and may be implemented in accordance with the principles of the present invention, such that no leakage paths will be created by circuit 700 while the circuit is cold-spared.

Blocking leakage paths while circuit 700 is cold-spared may be achieved by ensuring that the output of inverter 710 follows principles previously outlined. In particular, a cold-sparable inverter 710 for the bus-keeper latch may be designed as shown, using a back-to-back PMOS transistor pair 410 in the high-side to ensure low dissipation when cold-spared together with transistor 701 (N9) in the low-side. Furthermore, inverter 720, whose input is protected by CDM ESD circuitry 650, may also be designed in such a way as to further adhere to the principles of the present invention.

Figure 8:
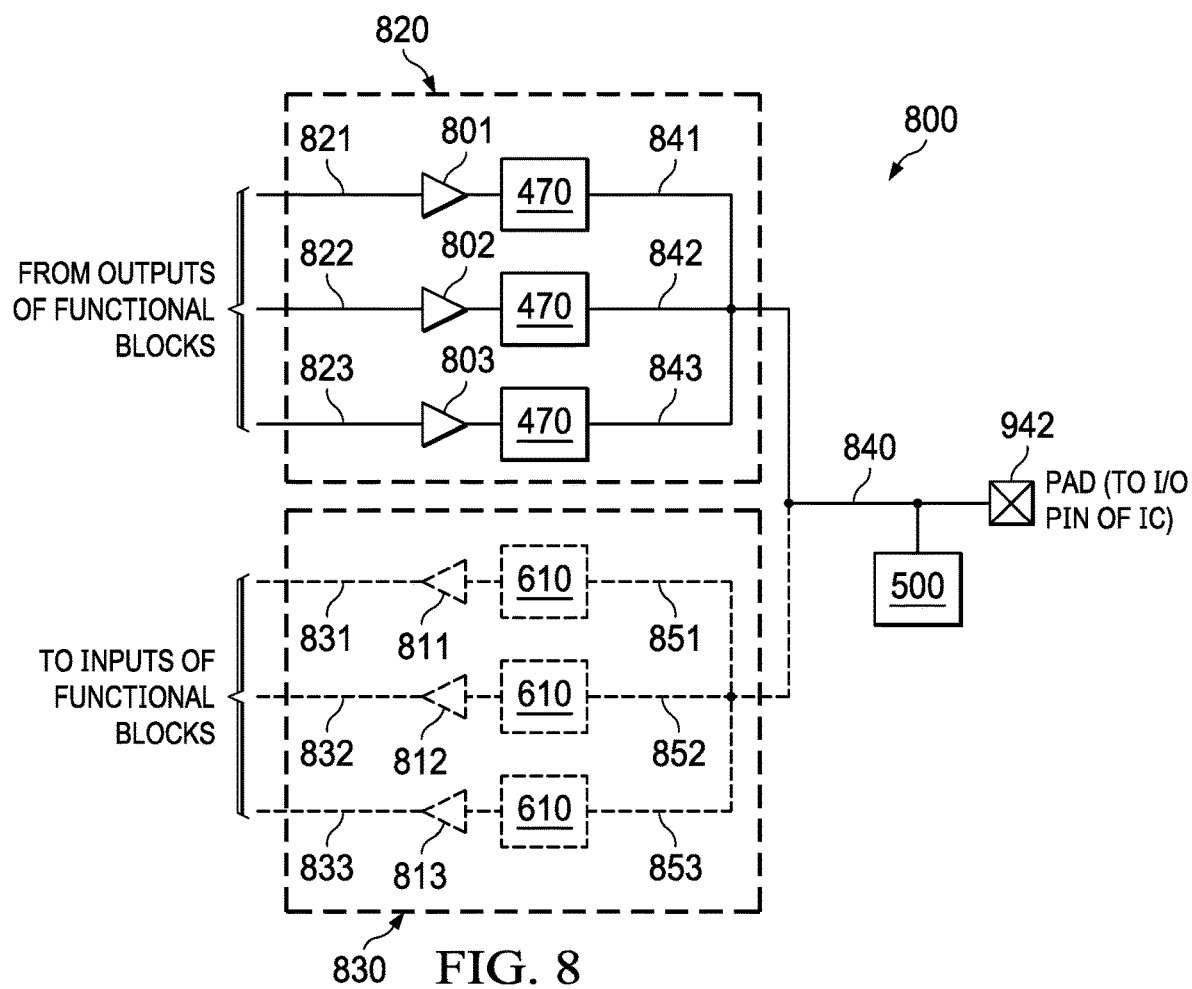
FIG. 8 is a schematic diagram of triple-redundant input and output circuitry to provide fault tolerance in accordance with another embodiment of the present invention.

FIG. 8 shows a schematic diagram of a cold-sparable triple-redundant majority-voting I/O circuit 800. This embodiment provides circuitry that performs a merging operation of multiple redundant inputs and/or multiple redundant outputs in accordance with another principle of the present invention, referred to as analog majority voting. The example shown in FIG. 8 shows a triple-redundant output circuit 820 that employs the triplication of redundant outputs that is supported by buffers 801, 802 and 803 and output drivers 470, which as in FIG. 5 may represent output circuits of any of the types 400, 420, or 450. Redundant output signals 841, 842, and 843 are added up at their outputs to create a sum at the output of that corresponds to the signals at input nodes 821, 822 and 823, said signals intended to be nominally identical and originating internally from identical circuits with identical stimuli. These internal identical circuits may be intended to perform the function of a logic gate, a flip-flop, a level shifter, or any other function. Potential instantaneous differences in the signals at 821, 822 and 823 may originate from causes such as SEE induced impulses, which, in the absence of such redundancy, could result in an observable glitch at the input/output (I/O) pad 942. The assumption is that since single-event effect (SEE) impacts are very localized in nature and are also relatively rare, such impact is very unlikely to be experienced in more than one circuit/branch in a given instance. Therefore, the analog majority voting feature can effectively ensure that whenever SEE is experienced in a given instance in one of the three triplicated circuits, the analog sum of the voltage signals from the three output branches 841, 842, and 843 that is created at I/O node 840, which includes the contributions from the two other branches that are not impacted, will be dominated by that majority of two. Hence, if, for example, the correct logic level at a given instance at 821, 822 and 823 is a high level, and the instantaneous result from SEE-affected branch 821 is a low level at node 841, then the summation at I/O node 840, realizing the analog majority voting, will be dominated by the high levels of 842 and 843, and appear as the correct high-level output at I/O pad 942. The aforementioned impact from an SEE is assumed to be local and the circuit is assumed to recover from it before another possible SEE affects any portion of circuit 800.

FIG. 8 further shows that if I/O pad 942 is optionally used as an input/output port and not just an output port, then a triple-redundant majority-voting input circuit 830 comprising multiple identical input buffers 811, 812, and 813 may optionally also be connected to it (through triplicate input paths 851, 852, and 853), each of which may have an input structure comprising cold-sparable input circuitry 610 as described in reference to FIG. 7, comprising CDM ESD protection circuitry 650 and also optionally including bus-keeper functionality provided by a cold-sparable bus-keeper latch 700. An input signal that would be applied into I/O pad 942 would then be replicated across the parallel branches, appearing identically at 831, 832 and 833, allowing each of the triplicated functions to respond accordingly. If, for example, the branch 851 whose first active element is buffer 811 is temporarily affected by an SEE, whether this is experienced early in the circuitry such as at node 831 or deeper into the functional circuitry that is fed by the signal at that node, then the functions that are fed by signals 832 and 833 can be made to overcome the impact of the SEE by dominating the respective output or outputs of the function into which that the signal at 831 feeds, e.g. by using the analog majority voting principle described above. Thus, redundancy is achieved that ensures that inputs of a device implementing this principle of the present invention may also be unaffected by (hardened against) SEE.

It should be recognized that the redundancy principle of the present invention is not limited to triplication of input/output branches and functional blocks (both referred to hereafter as 'elements') but may be employed with any number of multiple elements greater than 2 (e.g., 4), wherein it is assumed that the SEE is experienced only in a limited portion of the circuitry while the majority of elements that are not affected dominate the resulting sum of the multiple branches.

It should be further noted that in order for an I/O port to maintain the feature of leakage current avoidance during cold-sparing, in accordance with the present invention, all output branches are preferably equipped with circuitry 470 representing cold-sparable low-leakage output stages of the type described e.g. for circuit 400, 420, or 450, avoiding all possible leakage paths through an inactive output in a cold-spared unit. Cold-sparable low-leakage ESD protection circuitry is preferably employed on all input branches as described above in reference to circuits 500 and 600 or 610 (with optional low-leakage bus-keeper functionality provided by circuit 700), as illustrated in FIGS. 5, 6, and 7. An HBM ESD circuit 500 may be associated with pad 942 as shown to protect I/O signal 840 and all connected inputs and outputs, while separate CDM ESD circuits 610 (with or without optional bus-keeper input latches 700) may be associated with each input circuit 811, 812, and 813.

It will be appreciated that embodiments of the invention should not be limited to the particular implementations discussed above, and that those skilled in the art may employ the principles taught herein in various ways to achieve the same or similar goals of elimination or mitigation of undesired current paths into cold-spared circuits with or without having tri-stating capabilities for input and output ports. As an example, while the embodiments illustrated herein are designed for use with positive power supplies, alternative embodiments could be designed to operate similarly in cold-sparing systems using negative, or mixed, power supplies.

Other applications of these techniques will also be apparent, and therefore the scope of the invention is much broader than the few specific examples described herein. While the present invention has been particularly shown and described in detail with reference to several embodiments thereof, it will be understood by those skilled in the art that various modifications can be made in form and details therein without departing from the spirit and scope of the invention as set forth in the appended claims.

We claim:

1. A cold-sparable low-leakage output stage for a metal-oxide semiconductor IC, the IC having a first I/O pad, a positive supply terminal at potential $V_{DD}$, and a ground terminal at a ground potential $V_{SS}$, the output stage comprising:
- a low-side branch comprising a first NMOS transistor having a source connected to the ground terminal, a drain connected to the first I/O pad, and a gate driven by an NMOS drive path; and
- a high-side branch comprising
- a first pair of back-to-back PMOS transistors consisting of a first PMOS transistor having a drain connected to the first I/O pad, a gate driven by a PMOS drive path, and a source of the first PMOS transistor connected to a source of a second PMOS transistor, a drain of the second PMOS transistor being connected to the positive supply terminal,
- a second NMOS transistor having a source connected to the ground terminal, a drain connected to a gate of the second PMOS transistor, and a gate driven by an ENABLE_CLAMP_BAR signal held high during normal powered operation and brought low during cold-sparing,
- and a second pair of back-to-back PMOS transistors consisting of a third PMOS transistor and a fourth PMOS transistor, the third PMOS transistor having a drain connected to the first I/O pad, a gate driven by the ENABLE_CLAMP_BAR signal, and a source, the source of the third PMOS transistor being connected to a source of a fourth PMOS transistor, a drain of the fourth PMOS transistor being connected to the gate of the second PMOS transistor and to the drain of the second NMOS transistor, and a gate of the fourth PMOS transistor also driven by the ENABLE_CLAMP_BAR signal,
- whereby when the circuit is cold-spared with $V_{DD}$ at ground potential, the first pair of back-to-back PMOS transistors blocks a leakage path from the first I/O pad to the unpowered positive supply terminal, and the second pair of back-to-back PMOS transistors blocks a leakage path from the first I/O pad through the second NMOS transistor to the ground terminal.

2. The output stage of claim 1, wherein the ENABLE_CLAMP_BAR signal is generated externally to the IC.

3. The output stage of claim 1, wherein the drain of the third PMOS transistor is connected to the source of the first PMOS transistor and to the source of the second PMOS transistor, instead of being connected to the first I/O pad.

4. The output stage of claim 1, further comprising a second I/O pad to serve as a low-side pad, wherein the drain of the first NMOS transistor is disconnected from the first I/O pad and connected to the second I/O pad, and wherein the first I/O pad remains connected to the drain of the first PMOS transistor and serves as a high-side pad, whereby split complementary outputs are implemented.

5. The output stage of claim 1, further comprising
- a fifth PMOS transistor having a drain connected to the gate of the first PMOS transistor, a source connected to the positive supply terminal, and a gate driven by the ENABLE_CLAMP_BAR signal; and
- a switching circuit comprising
- a transmission gate connected between the PMOS drive path and the gate of the first PMOS transistor, and
- control logic controlled by the ENABLE_CLAMP_BAR signal to enable the transmission gate to pass a PMOS drive path signal to the gate of the first PMOS transistor during normal powered operation, and to disengage the PMOS drive path signal from the gate of the first PMOS transistor while in a powered tri-state mode as well as to block a leakage path from the I/O pad back into the PMOS drive path and the control logic while in a cold-spared mode,
- whereby tri-state capability as well as a low-leakage cold-spared mode are supported.

6. The output stage of claim 5, wherein the transmission gate comprises
- a fourth NMOS transistor having a gate connected to the positive supply terminal, a source connected to the gate of the first PMOS transistor, and a drain connected to the PMOS drive path through the control logic, and
- a third pair of back-to-back PMOS transistors consisting of a sixth PMOS transistor and a seventh PMOS transistor, a drain of the sixth PMOS transistor connected to the drain of the fourth NMOS transistor, a drain of the seventh PMOS transistor connected to the source of the fourth NMOS transistor and thence to the gate of the first PMOS transistor, a source of the sixth PMOS transistor and a source of the seventh PMOS transistor connected together, and a gate of the sixth PMOS transistor and a gate of the seventh PMOS transistor connected together and driven by an inverted form of the ENABLE_CLAMP_BAR signal.

7. The output stage of claim 5, further comprising a second I/O pad to serve as a low-side pad, wherein the drain of the first NMOS transistor is disconnected from the first I/O pad and connected to the second I/O pad, and wherein the first I/O pad remains connected to the drain of the first PMOS transistor and serves as a high-side pad, whereby split complementary outputs are implemented.

8. The output stage of claim 1, further comprising
- a sixth NMOS transistor and a seventh NMOS transistor, a source of the sixth NMOS transistor and a source of the seventh NMOS transistor both connected to the ground terminal, a drain of the sixth NMOS transistor and a drain of the seventh NMOS transistor both connected to the gate of the first NMOS transistor, and a gate of the sixth NMOS transistor and a gate of the seventh NMOS transistor both driven by an inverted form of the ENABLE_CLAMP_BAR signal,
- a capacitor having a first terminal connected to the first I/O pad and a second terminal connected to the gate of the sixth NMOS transistor, and with a value selected such that the sixth NMOS transistor will conduct on a transition at least as long as the first NMOS transistor will stay on due to a parasitic gate-drain capacitance of the first NMOS transistor,
- and a resistor connected between the gate of the first NMOS transistor and the ground terminal to hold the gate of the first NMOS transistor low during powering on of the output stage,
- whereby leakage caused by a transition at the gate of the first NMOS transistor due to an external signal at the first I/O pad during cold-sparing is prevented, while tri-state capability is also supported.

9. The output stage of claim 8, further comprising a second I/O pad to serve as a low-side pad, wherein the drain of the first NMOS transistor is disconnected from the first I/O pad and connected to the second I/O pad, and wherein the first I/O pad remains connected to the drain of the first PMOS transistor and serves as a high-side pad, whereby split complementary outputs are implemented, while leakage caused by a transition at the gate of the first NMOS transistor due to an external signal at the second I/O pad during cold-sparing is prevented, while tri-state capability is also supported.

10. The output stage of claim 1, further comprising a cold-sparable human-body model (HBM) electrostatic discharge protection circuit, wherein the HBM protection circuit comprises a clamp NMOS transistor having a clamp source, a clamp drain, a clamp gate, and a clamp body diode, wherein the clamp source and the clamp gate are both connected to the ground terminal, and the clamp drain is connected to the I/O pad, whereby an excessively high positive voltage applied externally to the I/O pad is clamped to the ground terminal by the clamp NMOS transistor through a breakdown mechanism, and a negative voltage applied externally to the I/O pad is clamped to the ground terminal by the clamp body diode, while blocking leakage paths to $V_{SS}$ when cold-spared, without loading valid logic signals originating either internally or externally at the I/O pad.

\* \* \* \* \*